US008842952B2

(12) United States Patent
Tanaka et al.

(10) Patent No.: US 8,842,952 B2
(45) Date of Patent: Sep. 23, 2014

(54) OPTICAL MODULE

(71) Applicant: Fujikura Ltd., Tokyo (JP)

(72) Inventors: Takayuki Tanaka, Sakura (JP); Sawako Yamai, Sakura (JP); Osamu Kikuchi, Sakura (JP); Susumu Okabe, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/974,232

(22) Filed: Aug. 23, 2013

(65) Prior Publication Data

US 2014/0064675 A1 Mar. 6, 2014

Related U.S. Application Data

(63) Continuation of application No. PCT/JP2012/077438, filed on Oct. 24, 2012.

(30) Foreign Application Priority Data

Dec. 26, 2011 (JP) ................................. 2011-284037
Dec. 26, 2011 (JP) ................................. 2011-284038

(51) Int. Cl.
*G02B 6/42* (2006.01)
*G02B 6/43* (2006.01)
*G02B 6/36* (2006.01)
*H05K 1/18* (2006.01)

(52) U.S. Cl.
CPC .. *G02B 6/43* (2013.01); *H05K 1/18* (2013.01); *G02B 6/4292* (2013.01); *G02B 6/42* (2013.01)
USPC .................... 385/52; 385/14; 385/88; 385/93

(58) Field of Classification Search
USPC ........................................................... 385/52
See application file for complete search history.

(56) References Cited

U.S. PATENT DOCUMENTS 6,114,221 A * 9/2000 Tonti et al. .................... 438/455
6,188,138 B1 * 2/2001 Bodo et al. .................... 257/778
(Continued)

FOREIGN PATENT DOCUMENTS

CN 101988975 A 3/2011
JP 5-226546 A 9/1993
(Continued)

OTHER PUBLICATIONS

International Search Report for PCT/JP2012/077438 dated Dec. 25, 2012.

(Continued)

*Primary Examiner* — Rhonda Peace
(74) *Attorney, Agent, or Firm* — Sughrue Mion, PLLC

(57) ABSTRACT

An optical module includes: a transparent substrate through which light can pass; a photoelectric conversion element mounted on the transparent substrate and emitting light toward the transparent substrate or receiving light having passed through the transparent substrate; and a support member supporting an optical fiber for transmitting light, the support member and the transparent substrate forming an optical path between the photoelectric conversion element and the optical fiber. A positioning hole is formed in the transparent substrate. A positioning pin having a tapered surface is formed on the support member. The transparent substrate and the support member are positioned with respect to one another by inserting the positioning pin into the positioning hole along the optical axis direction of light between the transparent substrate and the support member and by making the tapered surface of the positioning pin contact the edge of the positioning hole without leaving any space therebetween.

9 Claims, 12 Drawing Sheets

(56) References Cited

U.S. PATENT DOCUMENTS

| | | | | |
|---|---|---|---|---|
| 6,459,158 | B1 * | 10/2002 | Delprat et al. | 257/777 |
| 6,643,434 | B2 * | 11/2003 | Cayrefourcq et al. | 385/52 |
| 7,063,467 | B2 * | 6/2006 | Nagasaka et al. | 385/88 |
| 7,745,301 | B2 * | 6/2010 | Vora | 438/401 |
| 7,907,803 | B2 * | 3/2011 | Hodono | 385/14 |
| 8,055,105 | B2 * | 11/2011 | Hodono | 385/14 |
| 8,265,436 | B2 * | 9/2012 | Shih et al. | 385/52 |
| 2004/0234210 | A1 * | 11/2004 | Nagasaka et al. | 385/88 |
| 2007/0230889 | A1 | 10/2007 | Sato et al. | |
| 2007/0297713 | A1 * | 12/2007 | Lu et al. | 385/14 |
| 2009/0252455 | A1 | 10/2009 | Ohta et al. | |
| 2010/0254666 | A1 * | 10/2010 | Hodono | 385/88 |
| 2011/0026873 | A1 | 2/2011 | Hodono | |
| 2011/0108716 | A1 | 5/2011 | Shiraishi | |
| 2011/0135250 | A1 * | 6/2011 | Hodono | 385/14 |
| 2012/0251036 | A1 * | 10/2012 | Inoue et al. | 385/14 |
| 2014/0064675 | A1 * | 3/2014 | Tanaka et al. | 385/89 |

FOREIGN PATENT DOCUMENTS

| | | | |
|---|---|---|---|
| JP | 8-114892 | A | 5/1996 |
| JP | 2002-147676 | A | 5/2002 |
| JP | 2003-13383 | A | 1/2003 |
| JP | 2004-240220 | A | 8/2004 |
| JP | 2005-17684 | A | 1/2005 |
| JP | 2005-276264 | A | 10/2005 |
| JP | 2006-5209 | A | 1/2006 |
| JP | 2007-272124 | A | 10/2007 |
| JP | 2009-104096 | A | 5/2009 |
| JP | 2009-153776 | A | 7/2009 |
| JP | 2010-203233 | A | 9/2010 |
| JP | 2010-228732 | A | 10/2010 |
| JP | 2011-33876 | A | 2/2011 |
| JP | 2011-73106 | A | 4/2011 |
| JP | 2011-107206 | A | 6/2011 |
| JP | 2011-202561 | A | 10/2011 |
| JP | 2011-206980 | A | 10/2011 |
| JP | 2011-220137 | A | 11/2011 |
| JP | 2012-201310 | A | 10/2012 |
| JP | 2013-41716 | A | 2/2013 |

OTHER PUBLICATIONS

Office Action issued by Japanese Patent Office in Japanese Patent Application No. 2011-284037 mailed Apr. 2, 2013.

Office Action issued by Japanese Patent Office in Japanese Patent Application No. 2011-284038 mailed Apr. 16, 2013.

Office Action issued in corresponding Chinese Patent Application No. 201280004149.6 on Feb. 27, 2014.

* cited by examiner

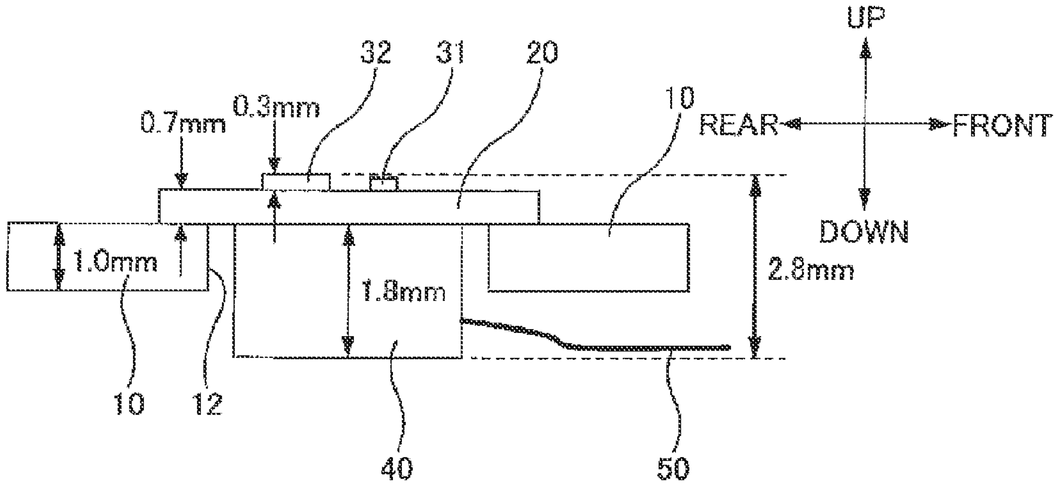
FIG. 5A (PRESENT EMBODIMENT)
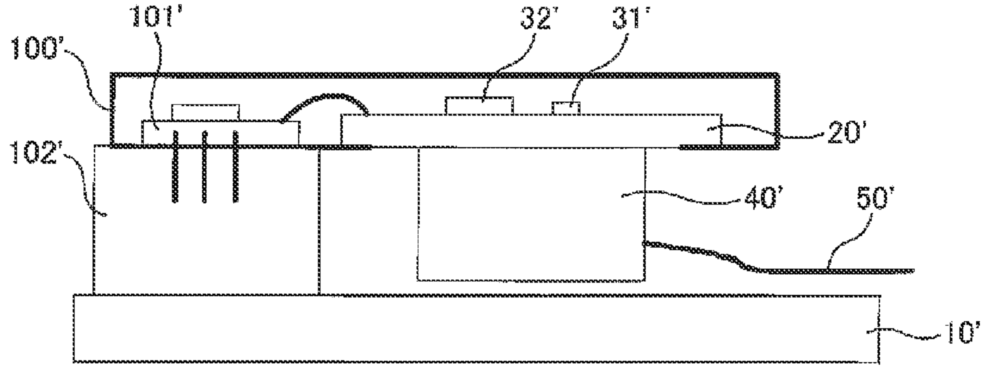
FIG. 5B (FIRST COMPARATIVE EXAMPLE)
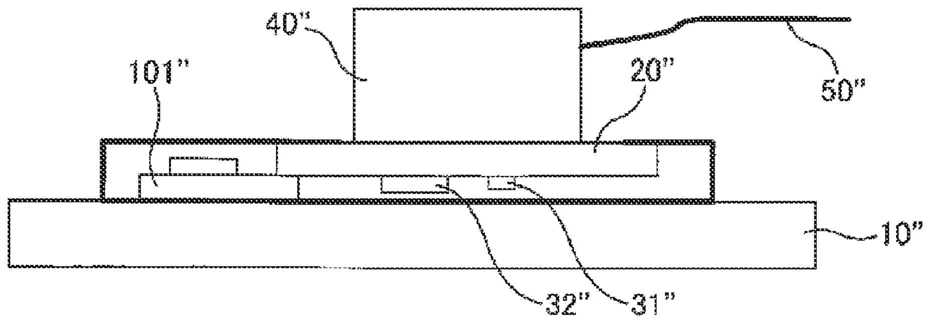
FIG. 5C (SECOND COMPARATIVE EXAMPLE)

(FIRST EMBODIMENT)

(REFERENCE EXAMPLE)

(FIRST EMBODIMENT)

(FIRST REFERENCE EXAMPLE)

(SECOND REFERENCE EXAMPLE)

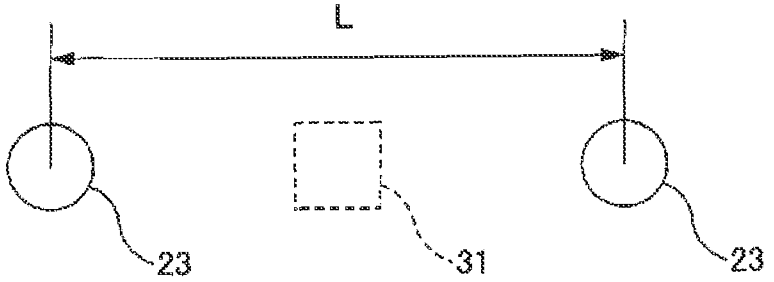
FIG. 12A (FIRST EMBODIMENT)
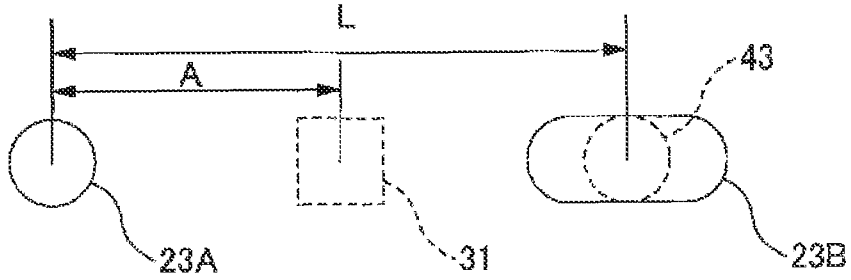
FIG. 12B (SECOND EMBODIMENT)

OPTICAL MODULE

This application is a Continuation Application of International Application No. PCT/JP2012/077438 filed Oct. 24, 2012, claiming priorities based on Japanese Patent Application Nos. 2011-284037 filed Dec. 26, 2011 and 2011-284038 filed Dec. 26, 2011, the entire contents of which are hereby incorporated by reference.

TECHNICAL FIELD

The present invention relates to optical modules.

BACKGROUND ART

In the field of high-speed optical communication using optical fibers, optical transceivers are used as components that mutually convert electric signals to/from optical signals. The specifications (the shape, dimensions, pin assignment, etc.) of pluggable optical transceivers are standardized according to an MSA (Multi Source Agreement) agreed upon by industry groups dealing in optical transceivers. In such a pluggable optical transceiver, a cage is provided on a main board on the side of a communications device (i.e., the host side), and an optical module, which is built-in with a photoelectric conversion element, a circuit board, and the like, is attachably/detachably inserted into the cage. When the optical module is inserted into the case, the circuit board in the optical module is electrically and mechanically connected to an electric interface connector in the cage. Thus, optical signals transmitted/received by an optical fiber and electric signals processed by the main board on the communications-device side can be mutually converted by the photoelectric conversion element and the circuit board in the optical module.

Patent Literature 1 discloses an optical module used in optical communication. The optical module of Patent Literature 1 includes: a transparent substrate having a photoelectric conversion element mounted on one surface thereof; and a support member that is arranged on the other surface of the transparent substrate and that supports an end of an optical fiber.

CITATION LIST

Patent Literature

Patent Literature 1: JP-A-2004-240220
Patent Literature 2: JP-A-2005-17684

SUMMARY OF INVENTION

Technical Problem

If the diameter of the positioning hole is made constant and the diameter of the positioning pin is also made constant and the pin has a columnar shape, it is necessary to provide a clearance between the positioning hole and the positioning pin due to fit tolerance, thus causing positioning error amounting to the clearance. This positioning error causes error in a direction perpendicular to the axial direction of the positioning hole and the positioning pin.

On the other hand, in case of transmitting light between the transparent substrate and the support member, it is necessary to increase positioning accuracy in a direction perpendicular to the optical axis direction of light at the time of positioning the transparent substrate and the support member with respect to one another. If positioning error occurs in the direction perpendicular to the light's optical axis direction due to the aforementioned fit tolerance, then optical coupling efficiency will deteriorate.

An objective of the present invention is to improve the optical coupling efficiency of the optical module.

Solution to Problem

A primary aspect of the invention for achieving the aforementioned objective is an optical module including: a transparent substrate through which light can pass; a photoelectric conversion element that is mounted on the transparent substrate and that emits light toward the transparent substrate or receives light having passed through the transparent substrate; and a support member that supports an optical fiber for transmitting light, the support member and the transparent substrate together forming an optical path between the photoelectric conversion element and the optical fiber. A positioning hole is formed in the transparent substrate; and a positioning pin having a tapered surface is formed on the support member. The transparent substrate and the support member are positioned with respect to one another by inserting the positioning pin into the positioning hole along the optical axis direction of light between the transparent substrate and the support member and by making the tapered surface of the positioning pin contact the edge of the positioning hole without leaving any space therebetween.

Other features of the present invention will be made clear by the Description and Drawings below.

Advantageous Effects of Invention

The present invention can improve the optical coupling efficiency of the optical module.

BRIEF DESCRIPTION OF DRAWINGS

FIG. 5A is an explanatory diagram of an arrangement of a circuit board 10, a glass substrate 20, a drive element 32, and an optical path changer 40 according to this embodiment. FIG. 5B is an explanatory diagram of an arrangement according to a first comparative example. FIG. 5C is an explanatory diagram of an arrangement according to a second comparative example.

FIG. 12A is an explanatory diagram of positioning holes 23 according to the first embodiment. FIG. 12B is an explanatory diagram of positioning holes according to a second embodiment.

DESCRIPTION OF EMBODIMENTS

Figure 1:
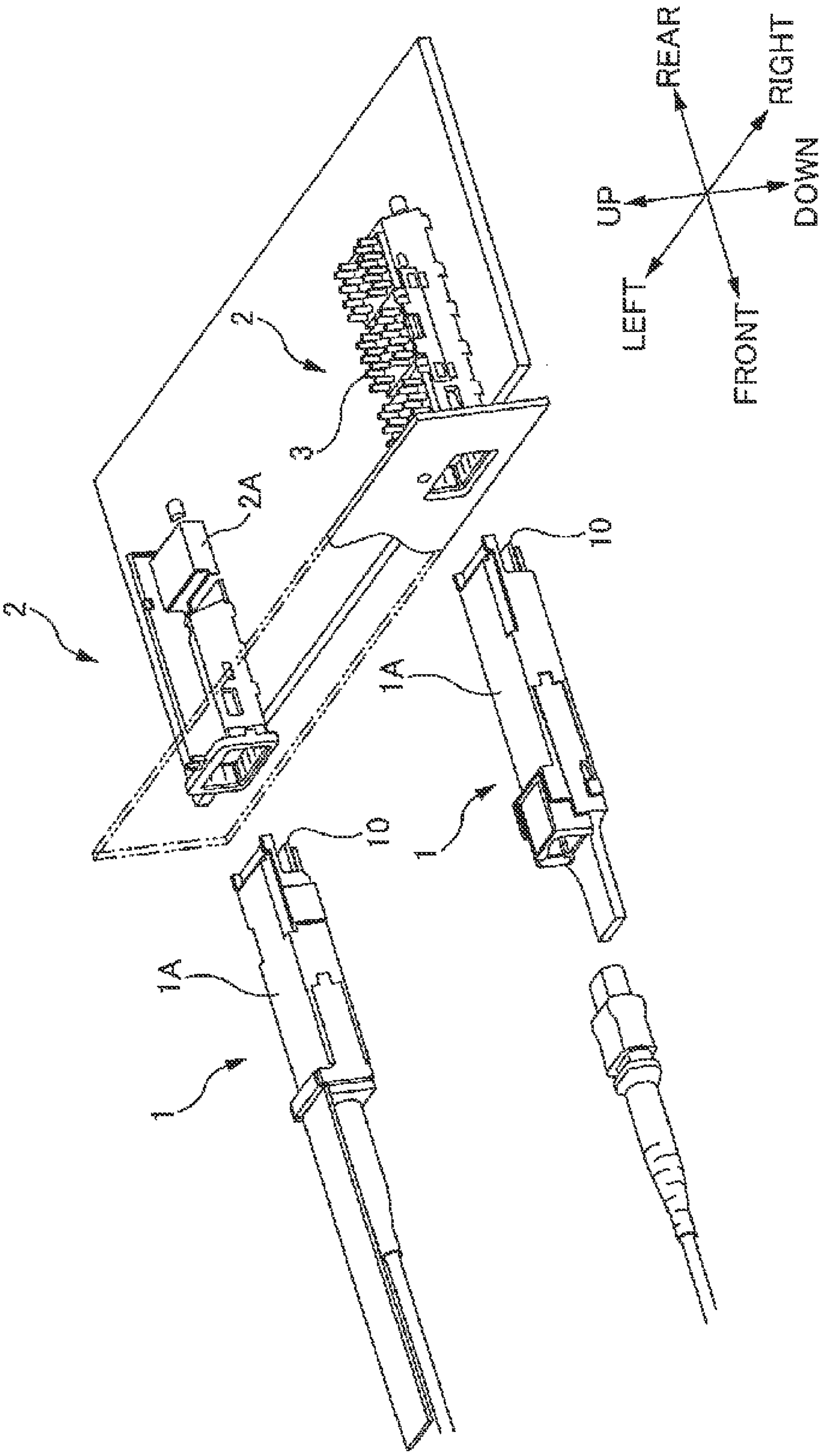
FIG. 1 is an explanatory diagram of a pluggable optical transceiver according to a first embodiment.

At least the following matters are made clear from the Description and Drawings described below.

(1)

Disclosed is an optical module that is attachable/detachable to/from a cage and that includes a circuit board to be connected to a connector of the cage, a transparent substrate that is mounted on the circuit board and through which light can pass, a photoelectric conversion element that is mounted on the transparent substrate and that emits light toward the transparent substrate or receives light having passed through the transparent substrate, and a support member that supports an optical fiber for transmitting light, the support member and the transparent substrate together forming an optical path between the photoelectric conversion element and the optical fiber, the optical module being characterized in that: a window is formed in the circuit board; the transparent substrate is mounted on the circuit board such that an opposite surface of the transparent substrate, which is opposite from a mounting surface where the photoelectric conversion element is mounted, closes the window; and the support member is attached to said opposite surface of the transparent substrate and is arranged so as to be inserted in the window of the circuit board.

With this optical module, height reduction can be achieved.

It is desirable that the support member is thicker than the element mounted on the mounting surface of the transparent substrate. In this way, further reduction in height can be achieved.

It is desirable that: a circuit-board-side electrode is formed on the circuit board so as to surround the window; a transparent-substrate-side electrode is formed on the transparent substrate on said opposite surface which is opposite from the mounting surface where the photoelectric conversion element is mounted, and a through via for wiring between the transparent-substrate-side electrode and the photoelectric conversion element is formed in the transparent substrate; and the transparent substrate is mounted on the circuit board so as to close the window while connecting the circuit-board-side electrode and the transparent-substrate-side electrode. In this way, height reduction can be achieved.

It is desirable that: a positioning hole is formed in the transparent substrate; a positioning pin is formed on the support member; and the transparent substrate and the support member are attachably/detachably positioned with respect to one another by inserting the positioning pin into the positioning hole. This makes it easy to replace the support member.

It is desirable that: the optical module further includes a force-applying member that applies a force in a direction in which the positioning pin is inserted into the positioning hole, and a heat-dissipating member that dissipates heat from the photoelectric conversion element; and the force-applying member is configured so as to apply a force in a direction in which the photoelectric conversion element and the heat-dissipating member are brought into tight contact. In this way, the heat of the photoelectric conversion element is dissipated easily.

It is desirable that the optical module further includes:

a second circuit board, a second transparent substrate, a second photoelectric conversion element, and a second support member which are separate from the circuit board, the transparent substrate, the photoelectric conversion element, and the support member; and a force-applying member that applies a force in a direction in which the positioning pin on the transparent substrate is inserted into the positioning hole in the transparent substrate, and that applies a force in a direction in which a positioning pin formed on the second support member is inserted into a positioning hole formed in the second transparent substrate. In this way, the force-applying member can be used advantageously.

It is desirable that: the positioning hole is a non-through hole that narrows toward the inside thereof; and the positioning pin has a truncated-cone shape. In this way, the transparent substrate and the support member can be positioned with high accuracy.

It is desirable that a recess is formed around the base of the positioning pin. In this way, even if the corner at the base of the positioning pin becomes rounded at the time of manufacturing the positioning pin, highly accurate positioning can be achieved without being affected by the rounded corner.

It is desirable that the positioning pin is formed by integrally molding the support member out of a resin. The corner at the base of the positioning pin tends to become rounded in cases where the support member is integrally molded out of a resin. Thus, the invention is particularly advantageous for such cases.

It is desirable that the positioning hole is formed by blasting. In cases where the positioning hole is formed by blasting, the inside of the positioning hole becomes narrow. Thus, the invention is particularly advantageous for such cases.

It is desirable that: a reference hole and a long hole are formed in the transparent substrate as the positioning holes; the long hole is formed such that the longitudinal direction thereof is along a line connecting the reference hole and the long hole; two truncated-cone-shaped positioning pins are formed on the support member; and the transparent substrate and the support member are positioned with respect to one another by inserting one of the two positioning pins into the reference hole and inserting the other positioning pin into the long hole. In this way, highly accurate positioning can be achieved, even if the spacing between the two positioning holes differs from the spacing between the two positioning pins.

It is desirable that an acceptable positioning error in the axial direction of the positioning hole and the positioning pin is greater than an acceptable positioning error in a direction perpendicular to the axial direction. The use of a truncated-cone-shaped positioning pin is particularly advantageous in such cases.

It is desirable that an optical system of the support member is configured such that, in a state where the transparent substrate and the support member are in tight contact, light emitted from the photoelectric conversion element converges onto a point farther than an end surface of the optical fiber. In this way, optical coupling efficiency is not impaired, even in cases where the transparent substrate and the support member are positioned slightly separated from one another. (In cases where positioning is performed by using a truncated-cone-shaped positioning pin, the transparent substrate and the support member may be positioned slightly separated from one another.)

It is desirable that the transparent substrate is harder than the support member. Such a configuration is acceptable, because even if the positioning pin on the support member deforms by contacting the positioning hole, the deformation of the positioning pin will end when the transparent substrate and the support member come into tight contact.

(2)

Incidentally, in positioning two members with respect to one another, a technique is known in which a positioning hole is formed in one member and a positioning pin is formed on the other member, and the two members are positioned by inserting the positioning pin into the positioning hole. For example, in the field of optical modules used in optical communication, the use of a positioning hole and a positioning pin is known for positioning a transparent substrate, which has a photoelectric conversion element mounted thereon, with respect to a support member, which supports an end of an optical fiber. (See, for example, Patent Literature 1 (JP-A-2004-240220) and Patent Literature 2 (JP-A-2005-17684).)

In Patent Literature 1, a positioning hole (guide hole) is formed as a through hole. However, the formation of a through hole creates an opening in both surfaces of the member, and the surfaces of the member cannot be used advantageously. For example, if a through hole is formed in the transparent substrate as in Patent Literature 1, it is not possible to arrange a photoelectric conversion element or wiring in the opening of the through hole.

Patent Literature 2 describes the formation of a positioning hole as a non-through hole. However, the non-through hole of Patent Literature 2 is a hole having a constant diameter. In forming a non-through hole, for reasons related to machining, the diameter may not become constant and instead a non-through hole that narrows toward the inside thereof may be formed.

An objective of a second invention is to achieve highly accurate positioning by using a non-through positioning hole that narrows toward the inside thereof.

At least the following matters are made clear from the Description and Drawings described below.

Disclosed is a positioning method for positioning a first member and a second member with respect to one another, the positioning method being characterized in that: anon-through positioning hole that narrows toward the inside thereof is formed in the first member; a truncated-cone-shaped positioning pin is formed on the second member; and the first member and the second member are positioned by inserting the positioning pin into the positioning hole.

With this positioning method, highly accurate positioning can be achieved by using a non-through positioning hole that narrows toward the inside thereof.

It is desirable that the positioning hole is formed by blasting. In cases where the positioning hole is formed by blasting, the inside of the positioning hole becomes narrow. Thus, the invention is particularly advantageous for such cases.

It is desirable that a recess is formed around the base of the positioning pin. In this way, even if the corner at the base of the positioning pin becomes rounded at the time of manufacturing the positioning pin, highly accurate positioning can be achieved without being affected by the rounded corner.

It is desirable that the positioning pin is formed by integrally molding the second member out of a resin. In cases where the second member is integrally molded out of a resin, the corner at the base of the positioning pin tends to become rounded. Thus, the invention is particularly advantageous for such cases.

It is desirable that: a reference hole and a long hole are formed in the first member as the positioning holes; the long hole is formed such that the longitudinal direction thereof is along a line connecting the reference hole and the long hole; two truncated-cone-shaped positioning pins are formed on the second member; and the first member and the second member are positioned with respect to one another by inserting one of the two positioning pins into the reference hole and inserting the other positioning pin into the long hole. In this way, highly accurate positioning can be achieved, even if the spacing between the two positioning holes differs from the spacing between the two positioning pins.

It is desirable that an acceptable positioning error in the axial direction of the positioning hole and the positioning pin is greater than an acceptable positioning error in a direction perpendicular to the axial direction. The use of a truncated-cone-shaped positioning pin is particularly advantageous in such cases.

It is desirable that: the first member is a transparent substrate through which light can pass; the second member is a support member that supports an optical fiber for transmitting light; a photoelectric conversion element that emits light toward the transparent substrate, or receives light having passed through the transparent substrate, is mounted on the transparent substrate; the support member and the transparent substrate together form an optical path between the photoelectric conversion element and the optical fiber; and the transparent substrate and the support member are positioned with respect to one another by inserting the positioning pin on the support member into the positioning hole in the transparent substrate. In such cases, it is acceptable that the positioning error in the optical axis direction is greater than the positioning error in directions perpendicular to the optical axis direction. Thus, the use of a truncated-cone-shaped positioning pin is particularly advantageous.

It is desirable that an optical system of the support member is configured such that, in a state where the transparent substrate and the support member are in tight contact, light emitted from the photoelectric conversion element converges onto a point farther than an end surface of the optical fiber. In this way, optical coupling efficiency is not impaired, even in cases where the transparent substrate and the support member are positioned slightly separated from one another. (In cases where positioning is performed by using a truncated-cone-shaped positioning pin, the transparent substrate and the support member may be positioned slightly separated from one another.)

It is desirable that the transparent substrate is harder than the support member. Such a configuration is acceptable, because even if the positioning pin on the support member deforms by contacting the positioning hole, the deformation of the positioning pin will end when the transparent substrate and the support member come into tight contact.

Also disclosed is an optical module including a transparent substrate through which light can pass, a photoelectric conversion element that is mounted on the transparent substrate and that emits light toward the transparent substrate or receives light having passed through the transparent substrate, and a support member that supports an optical fiber for transmitting light, the support member and the transparent substrate together forming an optical path between the photoelectric conversion element and the optical fiber, the optical module being characterized in that: a non-through positioning hole that narrows toward the inside thereof is formed in the transparent substrate; a truncated-cone-shaped positioning pin is formed on the support member; and the transparent substrate and the support member are positioned with respect to one another by inserting the positioning pin into the positioning hole.

With this optical module, the transparent substrate and the support member can be positioned with high accuracy by using a non-through positioning hole that narrows toward the inside thereof.

===Overview (1)===

FIG. 5A is an explanatory diagram of an arrangement of a circuit board 10, a glass substrate 20, a drive element 32, and an optical path changer 40 according to this embodiment.

In this embodiment, a glass substrate 20 (transparent substrate) is mounted on a circuit board 10. A light-emitting section 31 (photoelectric conversion element) and a drive element 32 are mounted on the upper surface (mounting surface) of the glass substrate 20. A housing window 12 (window) is formed in the circuit board 10. The glass substrate 20 is mounted on the circuit board 10 such that the lower surface (opposite surface from the mounting surface) of the glass substrate 20 closes the housing window 12. An optical path changer 40 (support member) that supports an end of an optical fiber 50 is attached to the lower surface of the glass substrate 20 and is arranged so as to be inserted in the housing window 12 of the circuit board 10.

In this embodiment, by arranging the members in this way, reduction in height can be achieved compared to a case where the circuit board 10, the glass substrate 20, the drive element 32, and the optical path changer 40 are arranged by being simply stacked on top of one another.

FIG. 5B is an explanatory diagram of an arrangement according to a first comparative example. This arrangement is substantially identical to the arrangement shown in FIG. 6 of aforementioned Patent Literature 1 (JP-A-2004-240220). A glass substrate 20' is molded integrally with a signal processing chip 101', thus constituting a hybrid integrated circuit 100'. A socket 102' is arranged on a circuit board 10', and the hybrid integrated circuit 100' is fixed to the socket. An optical path changer 40' supporting an optical fiber 50' is attached on the lower side of the glass substrate 20' and between the hybrid integrated circuit 100' and the circuit board 10'. In the arrangement of the first comparative example, the members (circuit board 10', glass substrate 20', drive element 32', and optical path changer 40') are arranged by being simply stacked on top of one another. Further, the glass substrate 20' is connected indirectly to the circuit board 10' via the socket 102', the signal processing chip 101', etc., and the glass substrate 20' is not connected directly to the circuit board 10'. As a result, in the arrangement of the first comparative example, the overall thickness is at least equal to or greater than the total value of the thicknesses of the circuit board 10', the glass substrate 20', the drive element 32', and the optical path changer 40'. Thus, height reduction cannot be achieved.

FIG. 5C is an explanatory diagram of an arrangement according to a second comparative example. This arrangement is substantially identical to the arrangement shown in FIG. 7 of aforementioned Patent Literature 1 (JP-A-2004-240220). Also in this arrangement, the members (circuit board 10", glass substrate 20", drive element 32", and optical path changer 40") are arranged by being simply stacked on top of one another. Further, the glass substrate 20" is connected indirectly to the circuit board 10" via a signal processing chip 101", etc., and the glass substrate 20" is not connected directly to the circuit board 10". As a result, also in the arrangement of the second comparative example, the overall thickness is at least equal to or greater than the total value of the thicknesses of the circuit board 10", the glass substrate 20", the drive element 32", and the optical path changer 40". Thus, height reduction cannot be achieved.

As can be understood from the comparison with the first and second comparative examples, the present embodiment can achieve height reduction by arranging the members as illustrated in FIG. 5A.

===Overview (2)===

Figure 8A:
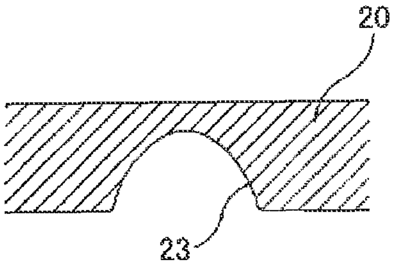
FIG. 8A is an explanatory diagram of a positioning hole 23 according to the first embodiment.
Figure 8B:
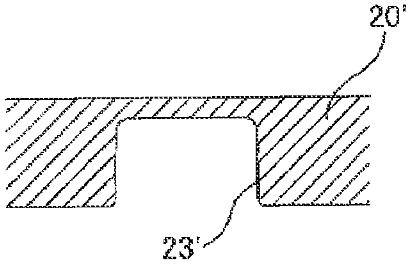
FIG. 8B is an explanatory diagram of a positioning hole 23' according to a reference example.

FIG. 8A is an explanatory diagram of a positioning hole 23 according to the present embodiment. As illustrated in the figure, in this embodiment, a non-through positioning hole 23 that narrows toward the inside thereof is formed in the glass substrate 20 (first member). In cases where a non-through hole is formed in the glass substrate 20 by sandblasting for example, the hole is not provided with a constant diameter as illustrated in FIG. 8B, but has a shape that narrows toward the inside.

Figure 9A:
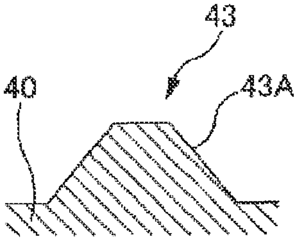
FIG. 9A is an explanatory diagram of a positioning pin 43 according to the first embodiment.

FIG. 9A is an explanatory diagram of a positioning pin 43 according to the present embodiment. As illustrated in the figure, in this embodiment, a truncated-cone-shaped positioning pin 43 is formed on the optical path changer 40 (second member; support member).

Figure 10A:
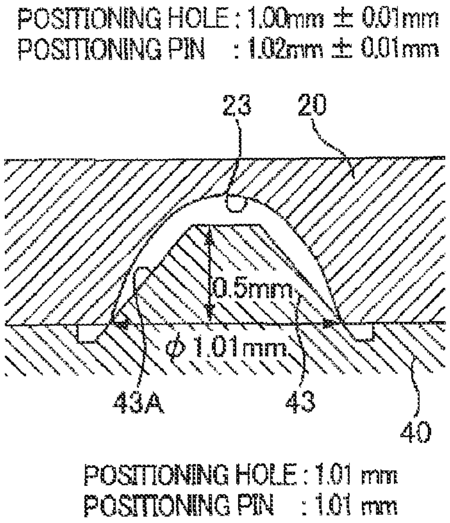
FIGS. 10A and 10B are diagrams explaining how the positioning hole 23 and the positioning pin 43 according to the first embodiment are fitted.
Figure 10B:
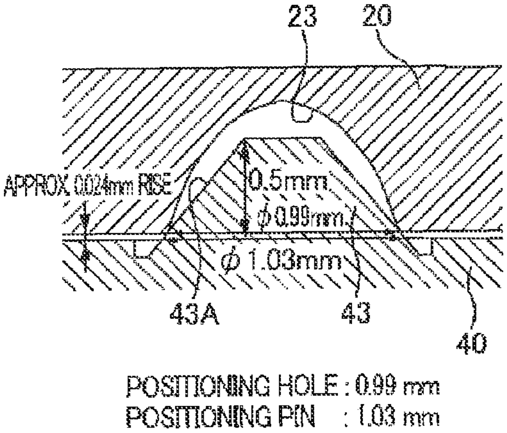

FIGS. 10A and 10B are diagrams explaining how the positioning pin 43 is inserted into the positioning hole 23 of the present embodiment. According to the present embodiment, the tapered surface of the truncated-cone-shaped positioning pin 43 can contact the positioning hole 23 without leaving any space therebetween (i.e., can contact the edge of the positioning hole without leaving any space therebetween), and thus, the glass substrate 20 (first member) and the optical path changer 40 (second member) can be positioned accurately.

Figure 9B:
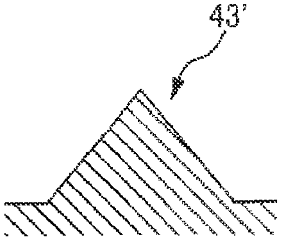
FIG. 9B is an explanatory diagram of a positioning pin 43' according to a first reference example.

It should be noted that, if the positioning pin 43' is conical as illustrated in FIG. 9B, then when the positioning pin 43' is inserted into a positioning hole 23 that narrows toward the inside, the tip end (vertex) of the positioning pin 43' may contact the bottom of the positioning hole 23. If the positioning pin 43" is columnar as illustrated in FIG. 9C, it is difficult to insert the pin into a positioning hole 23 that narrows toward the inside to begin with.

Figure 9C:
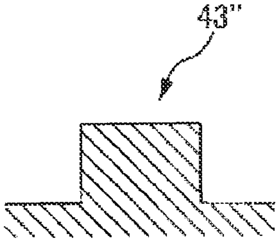
FIG. 9C is an explanatory diagram of a positioning pin 43" according to a second reference example.

Incidentally, positioning can be performed by inserting a columnar positioning pin 43" as illustrated in FIG. 9C into a constant-diameter positioning hole 23' as illustrated in FIG. 8B. In this case, however, it is necessary to provide a clearance between the positioning hole 23' and the positioning pin 43" due to fit tolerance, thus causing positioning error amounting to the clearance. In contrast, according to the present embodiment, the tapered surface of the truncated-cone-shaped positioning pin 43 can contact the positioning hole 23 without leaving any space therebetween as illustrated in FIGS. 10A and 10B, even in cases where dimensional tolerances are set for the positioning hole and the positioning pin, and thus, the glass substrate 20 (first member) and the optical path changer 40 (second member) can be positioned accurately.

First Embodiment

<Overall Configuration>

FIG. 1 is an explanatory diagram of a pluggable optical transceiver. It should be noted that, although there are cases where a component serving both as an optical transmitter and an optical receiver is called an optical transceiver, herein, a component having only one of the aforementioned functions is also called an optical transceiver. The pluggable optical transceiver illustrated in the figure is of the QSFP type (QSFP: Quad Small Form-factor Pluggable) as defined in the MSA (Multi-Source Agreement). The pluggable optical transceiver includes an optical module 1 and a cage 2.

The figure illustrates two types of optical modules 1. As illustrated in the figure, an optical fiber (including a cord) may be fixed to the optical module 1, or may be attachable/detachable thereto/therefrom. One of the two cages 2 in the figure is illustrated with its heat sink 3 removed and in a partially cut-away fashion to render the inside viewable.

In the explanation below, the front/rear, up/down, and left/right are defined as illustrated in FIG. 1. That is, the side of the insertion opening of the cage 2 into which the optical module 1 is inserted is defined as the "front", and the opposite side is the "rear". In the optical module 1, the side toward which the optical fiber (including the cord) extends is the "front", and the opposite side is the "rear". As viewed from the main board on which the cages 2 are provided, the side of the surface on which the cages 2 are provided is defined as "up", and the opposite side is "down". The direction orthogonal to the front/rear direction and up/down direction is defined as "left/right".

The cage 2 is provided on the main board on the side of a communications device (on the host side). For example, the cage 2 is provided on the main board of a blade server in a data center.

The optical module 1 is attachably/detachably inserted into the cage 2. The optical module 1 has a photoelectric conversion element 31, a circuit board 10, etc., built into its housing 1A, and mutually converts optical signals transmitted/received by the optical fiber and electric signals processed by the main board on the communications-device side.

The cage 2 attachably/detachably houses the optical module 1. The cage 2 has, on the front side, an insertion opening for the insertion of the optical module 1, and is a box-shaped member having a rectangular cross section and elongated in the front/rear direction. The cage 2 is formed by bending a metal sheet so that the front side thereof is open. By bending the metal sheet into a shape with a rectangular cross section, a housing section for housing the optical module 1 is formed inside the cage 2. A connector 2A is provided on the rear side inside the cage 2. When the optical module 1 is inserted into the cage 2, the circuit board in the optical module 1 is electrically and mechanically connected to the connector 2A in the cage 2. Thus, electric signals are conveyed between the optical module 1 and the main board.

An opening is formed in the upper surface of the cage 2, and a heat sink 3 is attached so as to close this opening. The heat sink 3 has a multitude of heat-dissipating fins (heat-dissipating pins) for dissipating heat of the optical module 1, which has been inserted into the cage 2, to the outside.

<Internal Configuration of Optical Module 1>

Figure 2A:
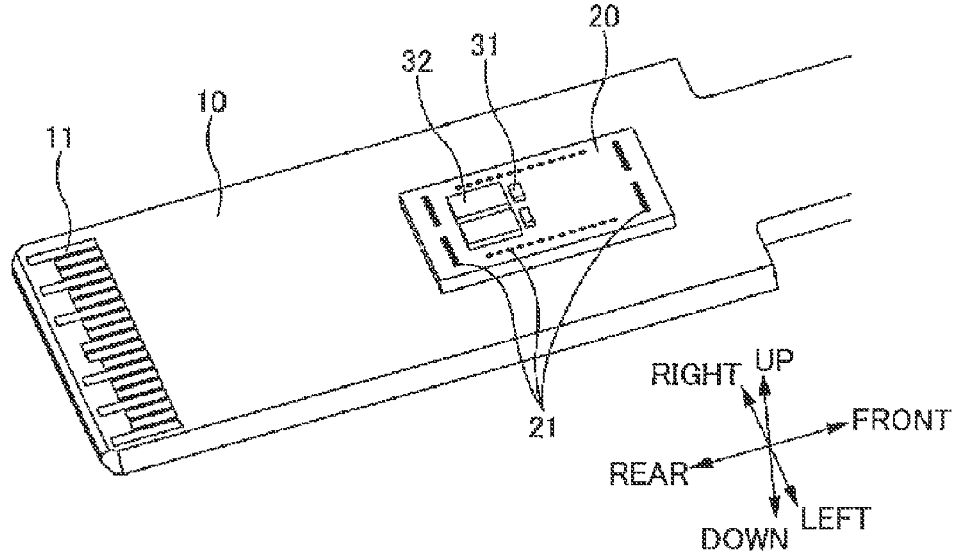
FIG. 2A is a perspective view of a circuit board, etc., in a housing 1A of an optical module 1 as viewed obliquely from above.
Figure 2B:
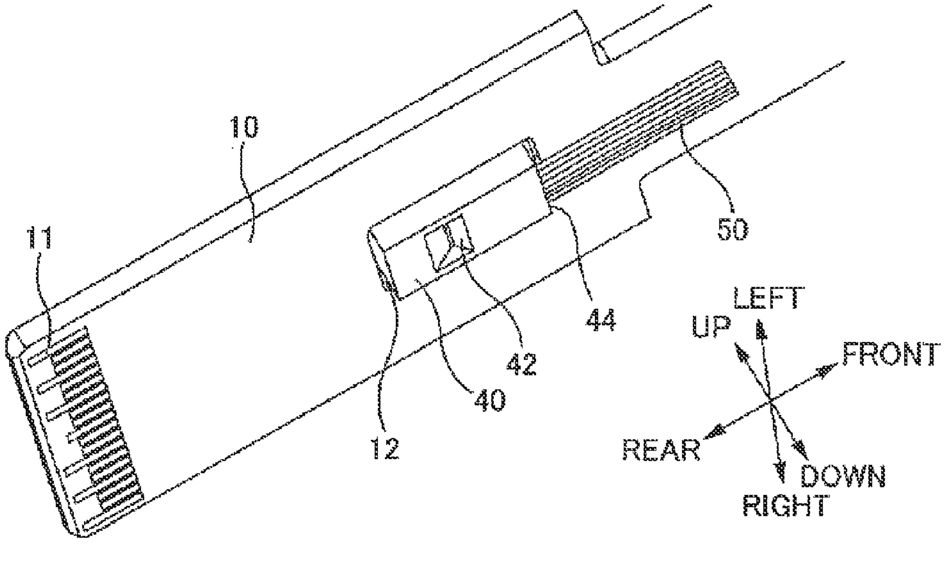
FIG. 2B is a perspective view thereof as viewed obliquely from below.
Figure 3:
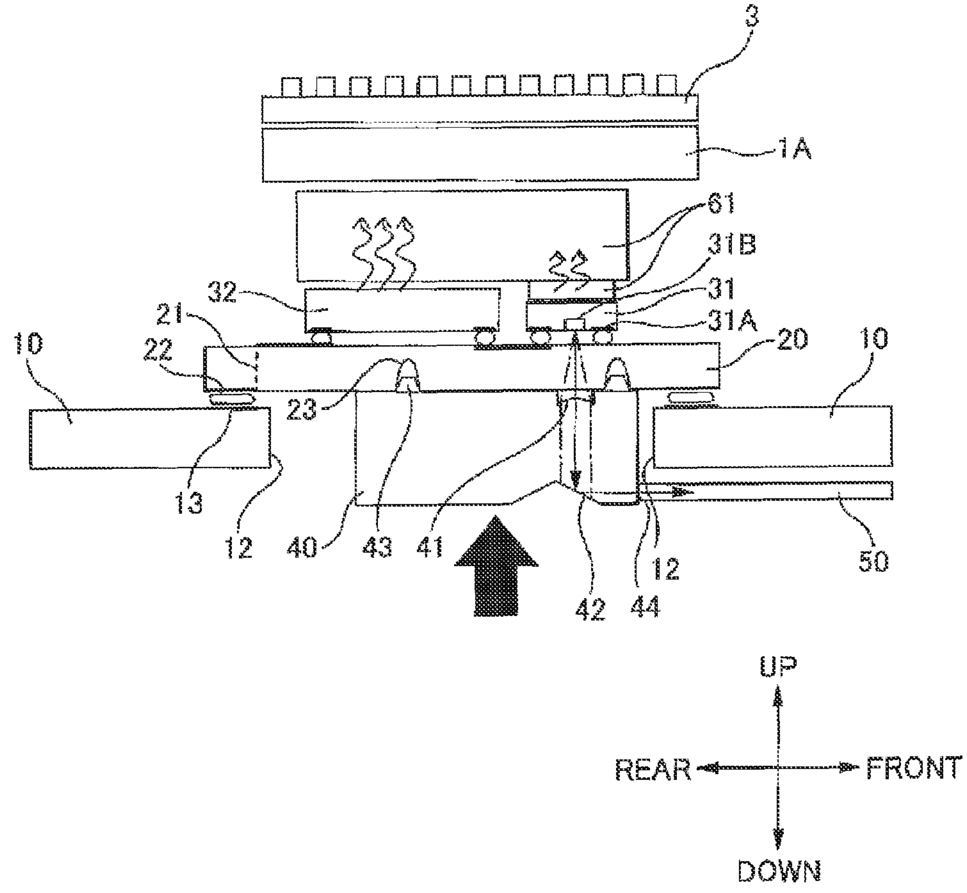
FIG. 3 is a schematic configuration diagram of the optical module 1 inserted in a cage 2.

FIG. 2A is a perspective view of a circuit board 10, etc., in a housing 1A of an optical module 1 as viewed obliquely from above. FIG. 2B is a perspective view thereof as viewed obliquely from below. FIG. 3 is a schematic configuration diagram of an optical module 1 inserted in a cage 2.

As illustrated in the figure, an optical module 1 includes a circuit board 10, a glass substrate 20, a light-emitting section 31, and an optical path changer 40 inside a housing 1A.

The circuit board 10 is a plate-shaped printed circuit board that constitutes an electronic circuit. A connecting section 11 (card edge connector) for connection with a connector 2A (connector socket) in a cage 2 is formed on the rear end section of the circuit board 10. The connecting section 11 is formed on both the upper and lower surfaces of the circuit board 10, and a multitude of terminals are formed so as to be aligned in the left/right direction.

A housing window 12 for housing the optical path changer 40 is formed in the circuit board 10. On the upper surface of the circuit board 10, a circuit-board-side electrode 13 is formed so as to surround the housing window 12. The glass substrate 20 is mounted on the upper side of the circuit board 10 so as to close the housing window 12. Stated differently, the housing window 12 of the circuit board 10 is located on the lower side of the glass substrate 20, and the lower surface of the glass substrate 20 closes the housing window 12 of the circuit board 10. It should be noted that a glass-substrate-side electrode 22 is formed on the lower surface of the glass substrate 20, and the glass substrate 20 is mounted on the circuit board 10 so as to close the housing window 12 of the circuit board 10 while connecting the circuit-board-side electrode 13 and the glass-substrate-side electrode 22.

The housing window 12 is a rectangular through hole formed in the circuit board 10. The upper side of the optical path changer 40 is inserted into this housing window 12. The lower side of the optical path changer 40 protrudes downward from the housing window 12, and from this protruding section, an optical fiber 50 extends toward the front. Note, however, that if the optical path changer 40 is thinner than the circuit board 10, the lower side of the optical path changer 40 will not protrude downward from the housing window 12. In this case, the optical fiber 50 can be drawn out easily from the optical path changer 40 by configuring a reflective section 42 so as to reflect light at an obtuse angle.

The glass substrate 20 is a transparent, glass-made substrate through which light can pass. A plurality of through vias 21 are formed in the glass substrate 20 along the shape of the housing window 12 of the circuit board 10.

The glass-substrate-side electrode 22 is formed on the lower surface (i.e., the surface opposite from the mounting surface where the light-emitting section 31 is mounted) of the glass substrate 20. The glass-substrate-side electrode is formed outside the through vias 21. Further, the glass-substrate-side electrode 22 is formed along the outside of the housing window 12 of the circuit board 10. The glass-substrate-side electrode 22 is to be electrically connected to the circuit-board-side electrode 13 on the upper surface of the circuit board 10. The through vias 21 are used for wiring between the glass-substrate-side electrode 22 and the light-emitting section 31 as well as a drive element 32.

Two positioning holes 23 for positioning the optical path changer 40 are formed in the lower surface of the glass substrate 20. The positioning holes 23 do not penetrate the glass substrate 20, and are formed as non-through holes. By forming the positioning holes 23 as non-through holes, it becomes possible to mount components (e.g. a drive element 32) on the upper side of the positioning holes 23 and to arrange wiring to such components, thus improving the degree of freedom in mounting components and arranging wiring on the upper surface of the glass substrate 20. As a result, the size of the glass substrate 20 can also be reduced. It should be noted that the shape etc. of the positioning hole 23 will be described further below.

The light-emitting section 31 is mounted on the upper surface of the glass substrate 20. A drive element 32 for driving the light-emitting section 31 is also mounted on the upper surface (i.e., the mounting surface where the light-emitting section 31 is mounted) of the glass substrate 20. The light-emitting section 31 and the drive element 32 are arranged inside the through vias 21. Stated differently, the light-emitting section 31 and the drive element 32 are mounted on the upper surface of the glass substrate 20 so as to be located on the upper side of the housing window 12 of the circuit board 10.

The light-emitting section 31 is a photoelectric conversion element that converts optical signals to/from electric signals. Herein, VCSEL (Vertical Cavity Surface Emitting Laser), which emits light vertical to the substrate, is adopted as the light-emitting section 31. It should be noted that a light-receiving section for converting optical signals into electric signals may be mounted on the glass substrate 20 as a photoelectric conversion element. Further, a light-emitting section and a light-receiving section may both be mounted on the glass substrate 20.

A light-emitting-section-side electrode 31A and light-emitting faces 31B of the light-emitting section 31 are formed on the lower surface, which is on the side of the glass substrate 20. The light-emitting section 31 is flip-chip mounted onto the glass substrate 20, and emits light toward the glass substrate 20. Because the light-emitting-section-side electrode 31A and the light-emitting faces 31B of the light-emitting section 31 are located on the same side (i.e., on the lower surface, which is on the side of the glass substrate 20), flip-chip mounting the light-emitting section 31 onto the glass substrate 20 will orient the light-emitting faces 31B toward the side of the glass substrate 20, and the light-emitting faces 31B will not be exposed to the outside.

It should be noted that, although only one light-emitting face 31B of the light-emitting section 31 is illustrated in FIG. 3, the light-emitting section 31 has a plurality of (e.g. four) light-emitting faces 31B aligned in the direction perpendicular to the paper face.

The optical path changer 40 is an optical member that changes the optical path of light emitted from the light-emitting section 31. The optical path changer 40 also functions as a support member that supports one end of the optical fiber 50 and that forms, together with the transparent substrate, an optical path between the light-emitting section 31 and the optical fiber 50. The optical path changer 40 includes a lens section 41 and a reflective section 42. The lens section 41 is formed on the upper surface of the optical path changer 40. The reflective section 42 is formed on the lower surface of the optical path changer 40.

The lens section 41 is a part formed in the shape of a convex lens so that light can converge. However, the lens section 41 is formed as a recess that is recessed from the upper surface (see FIG. 6) so that it does not protrude from the upper surface of the optical path changer 40. By forming the lens section 41 as a recess from the upper surface of the optical path changer 40, the upper surface of the optical path changer 40 and the lower surface of the glass substrate 20 can be in surface contact. The lens section 41 makes the light emitted from the light-emitting section 31 converge, guides the light to the reflective section 42, and makes the light enter the optical fiber 50. In cases where a light-receiving section is mounted on the glass substrate 20, the lens section 41 will make the light reflected from the reflective section 42 converge onto the light-receiving section. The lens section 41 is in opposition to the light-emitting faces 31B of the light-emitting section 31 across the glass substrate 20.

The reflective section 42 is apart for reflecting light. The optical axis of the light emitted from the light-emitting section 31 is along the up/down direction (direction perpendicular to the boards/substrates such as the circuit board 10 and the glass substrate 20), but the optical axis of the light reflected by the reflective section 42 is oriented in the front/rear direction (direction parallel to the boards/substrates such as the circuit board 10 and the glass substrate 20). The light reflected by the reflective section 42 enters the optical fiber 50 attached to the optical path changer 40. In cases where a light-receiving section is mounted on the glass substrate 20, the reflective section 42 will reflect the light having exited the optical fiber 50, guide the light to the lens section 41, and make the light converge onto the light-receiving section.

It should be noted that the reflective section 42 in the figure is illustrated such that the optical axis of the reflected light is oriented in the front/rear direction (direction parallel to the boards/substrates such as the circuit board 10 and the glass substrate 20). However, the reflective section 42 is not limited to a part that reflects light by 90 degrees. The reflective section 42 may be configured so as to reflect light at an obtuse angle (e.g., around 100 degrees). It will suffice if light whose optical axis is in the up/down direction (direction perpendicular to the boards/substrates such as the circuit board 10 and the glass substrate 20) is reflected so as to have a component in the front/rear direction (direction parallel to the boards/substrates such as the circuit board 10 and the glass substrate 20). For example, in cases where the base of the optical fiber 50 is located in a relatively upper part of the optical path changer 40 or where the thickness of the optical path changer 40 is thinner than the thickness of the circuit board 10, it is favorable to configure the reflective section 42 so that it reflects light at an obtuse angle, because the optical fiber 50 can be easily drawn out from the optical path changer 40.

One end of the optical fiber 50 is supported by a fiber support section 44 of the optical path changer 40, and the optical fiber 50 extends outward from the front side of the optical path changer 40. The optical fiber 50 is attached by being positioned so as to have a predetermined positional relationship with the lens section 41 and the reflective section 42 of the optical path changer 40.

The optical path changer 40 in the figure has the lens section 41 only in a part where light is incident. However, the optical path changer 40 may have two lens sections by providing a lens section also in apart from which light exits. By forming a collimator lens with the two lens sections, collimated light can be propagated in the optical path changer 40.

Two positioning pins 43 to be inserted into the respective positioning holes 23 of the glass substrate 20 are formed on the upper surface of the optical path changer 40 so as to protrude therefrom. By fitting the positioning pins 43 of the optical path changer 40 into the positioning holes 23 of the glass substrate 20, the optical axis of the lens section 41 of the optical path changer 40 is positioned with respect to the optical axis of the light-emitting section 31 mounted on the glass substrate 20. The shape etc. of the positioning pin 43 will be described further below.

The optical path changer 40 is molded integrally out of a resin. That is, the lens section 41, the reflective section 42, the positioning pins 43, and the fiber support section 44 of the optical path changer 40 are all formed integrally out of a resin.

As illustrated in FIG. 3, a heat-dissipating sheet 61 is arranged on the upper side of the light-emitting section 31 and the drive element 32. The heat-dissipating sheet 61 is made of a material having high thermal conductivity, and conducts heat generated by the light-emitting section 31 and the drive element 32 to the heat sink 3 of the cage 2.

Figure 4:
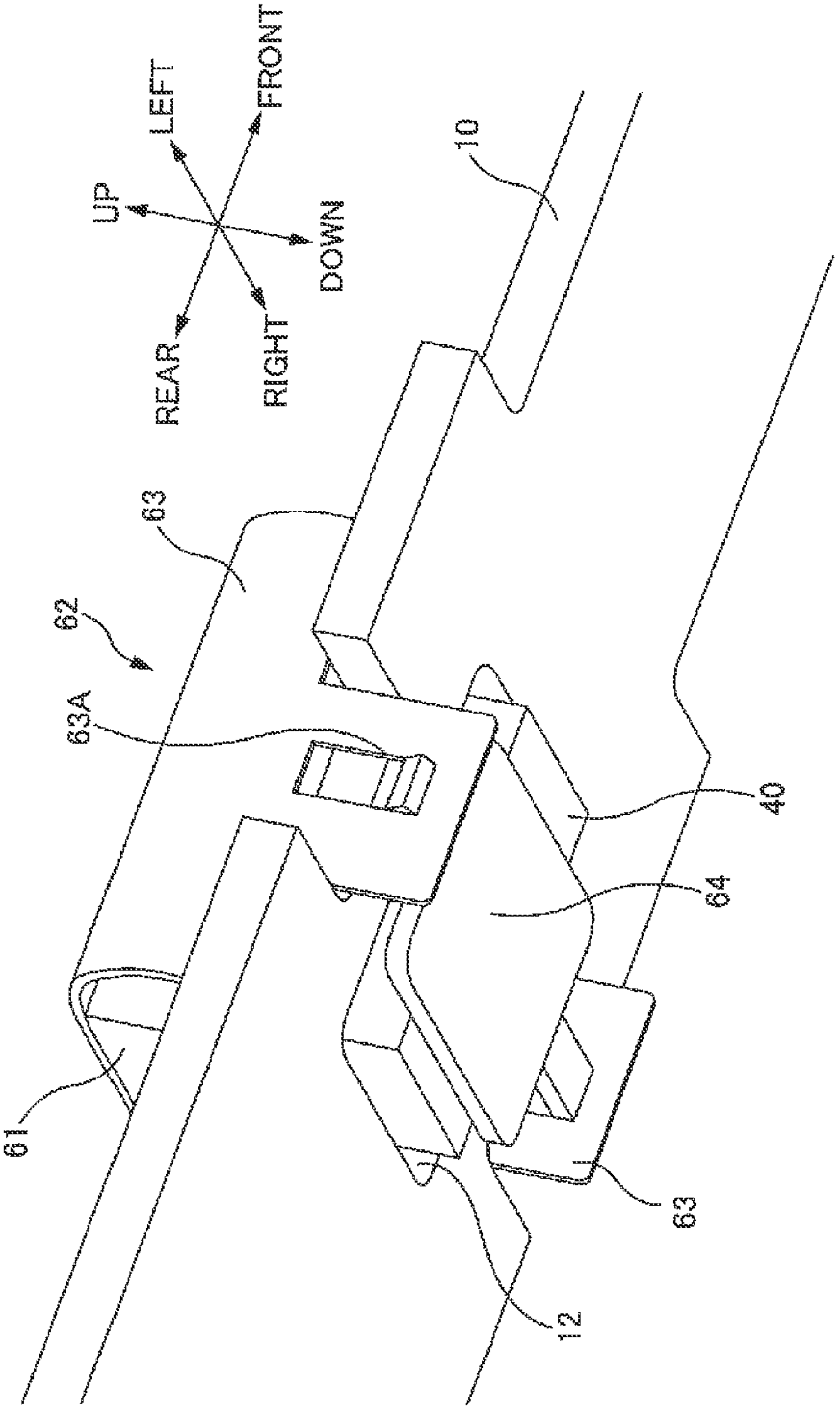
FIG. 4 is a perspective view of a fixing tool 62 for fixing an optical path changer 40.

FIG. 4 is a perspective view of a fixing tool 62 for fixing the optical path changer 40. The fixing tool 62 is made up of a body 63 formed by bending a metal sheet into a U-shaped cross section, and a fastening plate 64. The fastening plate 64 is fixed to one end of the body 63 with a U-shaped cross section. An engagement section 63A for fastening the fastening plate 64 is formed in the other end of the body 63.

The body 63 with a U-shaped cross section is arranged so as to cross over the circuit board 10 in the left/right direction and cover the heat-dissipating sheet 61 from above. Both ends of the body 63 protrude from the lower side of the circuit board 10. The fastening plate 64 is fastened to the engagement section 63A of the body 63 while pressing the lower surface of the optical path changer 40. When the fastening plate 64 is fastened to the engagement section 63A of the body 63, the fixing tool 62 tightly presses the members inside the body 63 (the glass substrate 20, the light-emitting section 31, the optical path changer 40, the heat-dissipating sheet 61, etc.) in the up/down direction.

The fastening plate 64 of the fixing tool 62 urges the optical path changer 40 upward, and the body 63 urges the glass substrate 20 downward via the heat-dissipating sheet 61. That is, the fixing tool 62 functions as a force-applying member that applies a force in the direction in which the positioning pins 43 of the optical path changer 40 are inserted into the positioning holes 23 of the glass substrate 20. Thus, the fit between the positioning holes 23 of the glass substrate 20 and the positioning pins 43 of the optical path changer 40 becomes reliable and less likely to be disengaged.

Further, the fastening plate 64 of the fixing tool 62 covers the outer side of the reflective section 42 of the optical path changer 40. Thus, the intrusion of dirt into the reflective section 42 can be prevented. The adhesion of dirt to the reflective section 42 may change the optical characteristics of the reflective section 42, but by covering the outer side of the reflective section 42 with the fastening plate 64, changes in the optical characteristics of the reflective section 42 can be prevented.

Further, the fixing tool 62 functions as a force-applying member that applies a force in the direction in which the light-emitting section 31 and the drive element 32 are brought into tight contact with the heat-dissipating sheet 61. This facilitates the conduction of heat generated by the light-emitting section 31 and the drive element 32 to the heat-dissipating sheet 61.

It should be noted that, because the state in which the positioning pins 43 are inserted in the positioning holes 23 is retained by the fixing tool 62, the glass substrate 20 can be disassembled from the optical path changer 40 by removing the fixing tool 62. That is, the glass substrate 20 and the optical path changer 40 are attachably/detachably positioned with respect to one another by inserting the positioning pins 43 in the positioning holes 23. Thus, the step of attaching the optical path changer 40 to the glass substrate 20 in the first embodiment is easy compared to cases where they are fixed by bonding. Further, because the optical path changer 40 is attached in a detachable fashion, the optical path changer 40 can be replaced in case of failure. (In contrast, if the optical path changer 40 is bonded and fixed to the glass substrate 20, the glass substrate 20 (as well as the circuit board 10) also needs to be replaced in case the optical path changer 40 fails, thus becoming expensive.)

<Arrangement of Circuit Board 10, Glass Substrate 20, Drive Element 32, and Optical Path Changer 40>

FIG. 5A is an explanatory diagram of an arrangement of the circuit board 10, the glass substrate 20, the drive element 32, and the optical path changer 40.

As illustrated in FIG. 5A, the circuit board 10 has a housing window 12 formed therein, and the glass substrate 20 is mounted on the upper side of the circuit board 10 so as to close the housing window 12. Further, the drive element 32 (as well as the light-emitting section 31) is mounted on the upper surface of the glass substrate 20, and the optical path changer 40 is attached to the lower surface of the glass substrate 20. The upper side of the optical path changer 40 is inserted in the housing window 12 of the circuit board 10, and the lower side of the optical path changer 40 protrudes more downward than the lower surface of the circuit board 10. Note, however, that the lower side of the optical path changer 40 does not protrude downward from the housing window 12 if the optical path changer 40 is thinner than the circuit board 10. In this case, by configuring the reflective section 42 so as to reflect light at an obtuse angle, the optical fiber 50 can be drawn out easily from the optical path changer 40.

As illustrated in the figure, the thickness (dimension in the up/down direction) of the circuit board 10 is 1.0 mm, the thickness of the glass substrate 20 is 0.7 mm, the thickness of the drive element 32 is 0.3 mm, and the thickness of the optical path changer 40 is 1.8 mm. The light-emitting section 31 is a component thinner than the drive element 32, so the light-emitting section 31 is ignored here. Note, however, that if the light-emitting section 31 is thicker than the drive element 32, then the thickness of the light-emitting section 31 will be taken into consideration instead of the drive element 32.

The optical path changer 40 is the thickest component compared to the other components, in order to secure the dimensions of the reflective section 42 and dimensions for connecting the end of the optical fiber 50. In the first embodiment, overall height reduction is achieved by arranging the thick optical path changer 40 so that it is inserted in the housing window 12 of the circuit board 10. More specifically, in the first embodiment, the overall thickness is 2.8 mm (=1.8 mm+0.7 mm+0.3 mm), which is thinner than 3.5 mm (=1.0 mm+0.7 mm+1.8 mm), even though the 0.7-mm-thick glass substrate 20 is mounted on the 1.0-mm-thick circuit board 10, and the 1.8-mm-thick optical path changer 40 is attached to the glass substrate 20.

Incidentally, if the drive element 32 etc. is inserted in the housing window 12, the drive element 32 and the light-emitting section 31, which are heat-generating elements, will be arranged near the circuit board 10, and may affect the other components mounted on the circuit board 10—e.g., may impair component life. Even if consideration is given to the arrangement of the other components so that they are not affected, the degree of freedom in circuit design of the circuit board 10 will deteriorate. Further, if the drive element 32 etc. is inserted in the housing window 12, the heat-dissipating sheet etc. needs to be attached inside the housing window 12, which will make heat dissipation process difficult. In contrast, the insertion of the optical path changer 40 in the housing window 12 causes none of these problems, because the optical path changer 40 is a passive component and does not generate heat.

As described above, in the first embodiment, height reduction is achieved by forming a housing window 12 in the circuit board 10 and inserting, in the housing window 12, the component (the optical path changer 40 herein) attached to one surface of the glass substrate 20 among the components attached to both surfaces of the glass substrate.

Height reduction can be achieved effectively by inserting, in the housing window 12, the thicker component among the components (the drive element 32 and the optical path changer 40 herein) attached to the respective surfaces of the glass substrate 20. That is, height reduction can be achieved more effectively if the component inserted in the housing window 12 (the optical path changer 40 herein) is thicker than the component attached to the upper surface of the glass substrate (the drive element 32 herein). Particularly, in cases where the component attached to one surface of the glass substrate 20 (the optical path changer 40 herein) is thicker than the circuit board 10 and the component attached to the other surface of the glass substrate 20 (the drive element 32 herein) is thinner than the circuit board 10, height reduction can be achieved effectively by inserting the thicker component in the housing window 12.

Further, in the first embodiment, the circuit board 10, the glass substrate 20, the drive element 32, and the optical path changer 40 are arranged such that the heat-generating drive element 32 (as well as the light-emitting section 31) is on the upper side of the glass substrate 20. With this configuration, heat can be dissipated easily to the heat sink 3 on the upper side of the cage 2.

<Acceptable Positioning Error Between Glass Substrate 20 and Optical Path Changer 40>

Figure 6A:
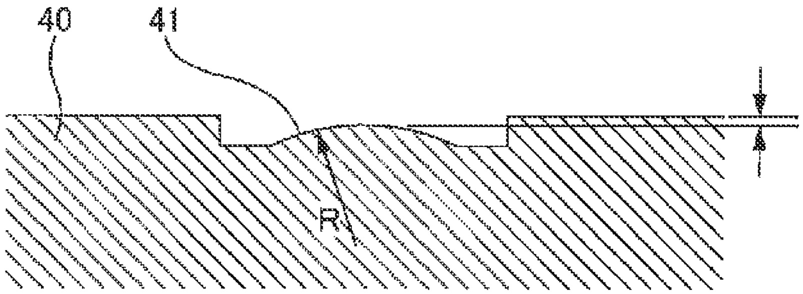
FIG. 6A is an explanatory diagram of the radius of curvature R of a lens section 41 of the optical path changer 40.
Figure 6B:
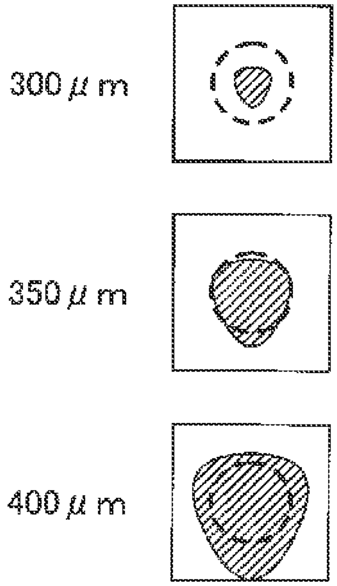
FIG. 6B includes diagrams explaining the relationship between an optical fiber core and spots of light.

FIG. 6A is an explanatory diagram of the radius of curvature R of the lens section 41 of the optical path changer 40. As already described above, the lens section 41 is apart having the shape of a convex lens formed so that it does not protrude from the upper surface of the optical path changer 40. FIG. 6B includes diagrams explaining the relationship between the core of the optical fiber 50 and spots of light. The dotted line in each figure indicates the core of the optical fiber 50, and the hatched region indicates the spot of light on the end surface of the optical fiber 50. Here, the optical coupling efficiencies of three types of lens sections 41 each having a different radius of curvature R (300 μm, 350 μm, and 400 μm) are studied.

As illustrated in FIG. 6B, the smaller the radius of curvature R of the lens section 41 is, the more the spot of light is focused on the position of the end surface of the optical fiber 50, and the higher the optical coupling efficiency becomes. More specifically, the optical coupling efficiency is 81% at R=300 μm, the optical coupling efficiency is 33% at R=350 μm, and the optical coupling efficiency is 22% at R=400 μm. When the radius of curvature R is 300 μm, the focal point (herein, the point onto which the light emitted from the light-emitting section 31 converges) is located near the end surface of the optical fiber 50. In contrast, when the radii of curvature R are 350 μm and 400 μm, the focal point is positioned at a point separated from the end surface of the optical fiber 50 (in a so-called rear-focus state), compared to when the radius of curvature R is 300 μm. Thus, for cases where the radii of curvature R are 350 μm and 400 μm, the spots of light are wider compared to the case where the radius of curvature R is 300 μm.

The optical coupling efficiency changes when the relative positional relationship between the glass substrate 20 and the optical path changer 40 is misaligned. Also, the degree of change in optical coupling efficiency will differ depending on the direction of misalignment. This will be explained below.

Figure 7A:
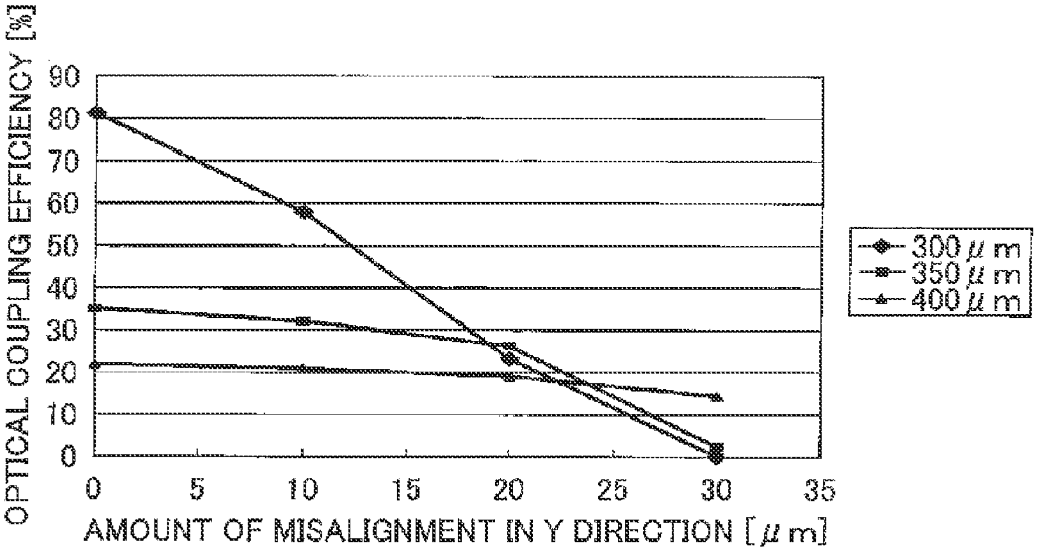
FIG. 7A is a graph indicating relationships between optical coupling efficiency (%) and the amount of misalignment (μm) for when the glass substrate and the optical path changer 40 are misaligned in the Y direction, which is perpendicular to the optical axis of the lens section 41.

FIG. 7A is a graph indicating relationships between optical coupling efficiency (%) and the amount of misalignment (μm) for when the glass substrate 20 and the optical path changer 40 are misaligned in the Y direction (front/rear direction or left/right direction), which is perpendicular to the optical axis of the lens section 41. In cases where the direction of misalignment is perpendicular to the optical axis of the lens section 41, the spot of light will be shifted so as to move outside the core of the optical fiber 50. Thus, when the amount of misalignment in the Y direction reaches roughly half the core diameter (around 50 μm), the optical coupling efficiency becomes almost zero. Further, the change in optical coupling efficiency with respect to the amount of misalignment becomes more significant in cases where the radius of curvature R of the lens section 41 is smaller. Thus, positional misalignment in the Y direction is hard to accept.

Figure 7B:
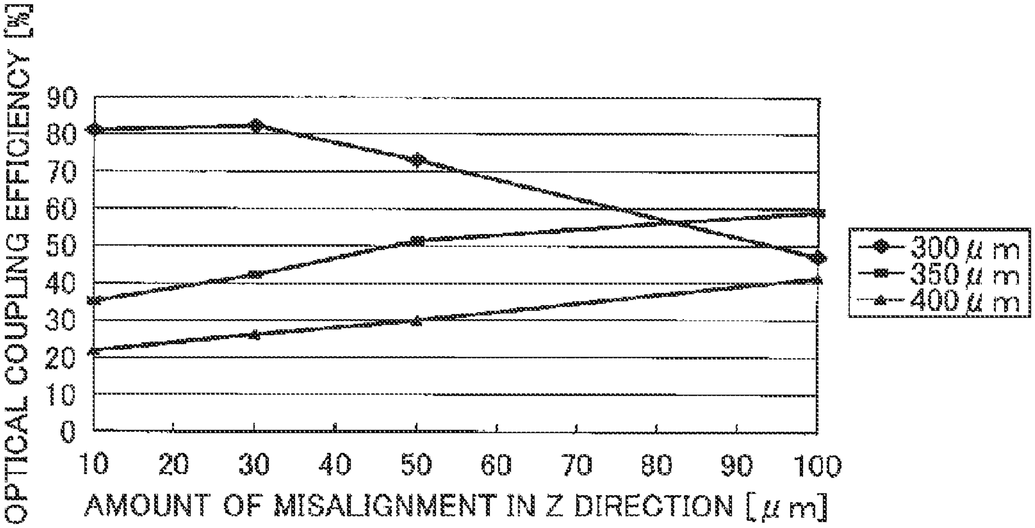
FIG. 7B is a graph indicating relationships between optical coupling efficiency (%) and the amount of misalignment (μm) for when the glass substrate and the optical path changer 40 are misaligned in the Z direction, which is parallel to the optical axis of the lens section 41.

FIG. 7B is a graph indicating relationships between optical coupling efficiency (%) and the amount of misalignment (μm) for when the glass substrate 20 and the optical path changer 40 are misaligned in the Z direction (up/down direction), which is parallel to the optical axis of the lens section 41. In cases where the direction of misalignment is parallel to the optical axis of the lens section 41, the spot of light will not move outside the core of the optical fiber 50, although the size of the spot of light will change. Thus, even in cases where the amount of misalignment in the Z direction is large—for example, even if the amount of misalignment in the Z direction reaches roughly half the core diameter—the optical coupling efficiency will not become zero. Thus, positional misalignment in the Z direction is easier to accept.

As described above, relative positional misalignment between the glass substrate 20 and the optical path changer 40 is hard to accept in the Y direction, which is perpendicular to the optical axis of the lens section 41, but easy to accept in the Z direction, which is parallel to the optical axis of the lens section 41. This means that, at the time of positioning the glass substrate 20 and the optical path changer 40 with respect to one another, positioning error in a direction parallel to the surface of the glass substrate 20 (corresponding to the Y direction) is hard to accept, but positioning error in the direction perpendicular to the surface of the glass substrate 20 (corresponding to the Z direction) is easy to accept.

Thus, positioning between the glass substrate 20 and the optical path changer 40 needs to be more accurate in the Y direction than the Z direction. In the first embodiment, the positioning holes 23 of the glass substrate 20 and the positioning pins 43 of the optical path changer 40 are configured such that positioning can be done with high accuracy in the Y direction, as will be described further below.

Incidentally, as illustrated in FIG. 7B, in the optical path changer 40 of the first embodiment, the optical coupling efficiency increases with the increase in the amount of misalignment in the Z direction in cases where the radii of curvature R of the lens section 41 are 350 μm and 400 μm. The reason to this is considered as follows. This optical path changer 40 is formed such that the focal point (herein, the point onto which the light emitted from the light-emitting section 31 converges) is located near the end surface of the optical fiber 50 when the lens section 41 has a radius of curvature R of 300 μm. The larger the radius of curvature, the longer the focal distance becomes; so when the radii of curvature Rare 350 μm and 400 μm in this optical path changer 40, the focal point is positioned at a point farther from the end surface of the optical fiber 50 (in a so-called rear-focus state). Because the optical path changer 40 is configured as above, in cases where the radii of curvature R are 350 μm and 400 μm, it is thought that the focal point comes near the end surface of the optical fiber 50 when the glass substrate 20 and the optical path changer 40 are separated from one another (i.e., the distance between the light-emitting section 31 mounted on the glass substrate 20 and the lens section 41 increases), and thus the optical coupling efficiency is improved.

As described further below, when the positioning pins 43 are fitted into the positioning holes 23, there are cases where the glass substrate 20 and the optical path changer 40 are positioned slightly separated from one another in the Z direction. Taking into consideration that positioning is done in such a way, it is desirable that the optical system (the lens section 41, the reflective section 42, etc.) of the optical path changer 40 is configured such that, in a state where the lower surface of the glass substrate 20 and the upper surface of the optical path changer 40 are in tight contact (i.e., the amount of misalignment in the Z direction is zero), the point (focal point) where the light emitted from the light-emitting section 31 converges is located at a point farther than the end surface of the optical fiber 50. In this way, when the glass substrate 20 and the optical path changer 40 are positioned slightly separated from one another in the Z direction, it is possible to at least prevent deterioration in optical coupling efficiency.

<Positioning Hole 23 and Positioning Pin 43>

FIG. 8A is an explanatory diagram of a positioning hole according to the first embodiment. FIG. 8B is an explanatory diagram of a positioning hole 23' according to a reference example. In the first embodiment, non-through holes are formed in the glass substrate 20 as the positioning holes 23. The reason for forming non-through holes is that, by forming the positioning holes 23 as non-through holes, it is possible to improve the degree of freedom in mounting components and arranging wiring on the upper surface of the glass substrate 20.

One conceivable method for forming non-through holes in the glass substrate 20 is a machining method using a drill. When a non-machined hole is formed with a drill, a hole with a constant diameter regardless of depth is formed in the glass substrate 20', as illustrated in FIG. 8B. However, machining with a drill may become expensive. So, the first embodiment adopts sandblasting with which non-through holes can be formed inexpensively. However, in cases where a non-through hole is formed by sandblasting, the hole shape becomes narrow toward the inside (see FIG. 8A), although the hole diameter (opening diameter) can be formed accurately on the surface of the glass substrate 20. Thus, on the inside of the hole, dimensional accuracy in terms of hole diameter and depth becomes extremely poor.

FIG. 9A is an explanatory diagram of a positioning pin 43 according to the first embodiment. FIG. 9B is an explanatory diagram of a positioning pin 43' according to a first reference example. FIG. 9C is an explanatory diagram of a positioning pin 43" according to a second reference example.

The positioning pin 43" according to the second reference example illustrated in FIG. 9C has a columnar shape (cylindrical shape) with a constant pin diameter. In the case of such a columnar positioning pin 43", it is not possible to perform positioning by inserting the pin into a positioning hole 23 that narrows toward the inside as illustrated in FIG. 9A. If the positioning hole 23 is shaped as illustrated in FIG. 8B, it may be possible to perform positioning by inserting the positioning pin 43" of the second reference example illustrated in FIG. 9C. In this case, however, it is necessary to provide a clearance between the positioning hole 23' and the positioning pin 43" due to fit tolerance, thus causing positioning error amounting to the clearance. (As already described above, it is hard to accept positioning error in directions perpendicular to the axial direction of the positioning hole 23 and the positioning pin 43 (i.e., directions parallel to the surface of the glass substrate 20; Y direction).)

The positioning pin 43' of the first reference example illustrated in FIG. 9B is conical. If a positioning pin 43' with such a shape is inserted into a positioning hole 23 that narrows toward the inside as illustrated in FIG. 8A, the tip end of the positioning pin 43' may contact the bottom of the positioning hole 23, and in this case, positioning cannot be performed.

It should be noted that, although it is possible to reduce the height of the positioning pin 43' of the first reference example and configure the positioning pin 43' such that its tip end does not contact the bottom of the positioning hole 23, in this case, the angle of the tapered surface becomes small (i.e., the positioning pin 43' becomes flat in shape as a whole). Thus, insertion into the positioning hole 23 may become difficult, or the fittability into the positioning hole 23 may deteriorate, and as a result, the optical axis may be misaligned.

In contrast, the positioning pin 43 of the first embodiment has a truncated-cone shape as illustrated in FIG. 9A. That is, the positioning pin 43 of the first embodiment is shaped as if a cone has been truncated by a plane parallel to the bottom surface and the portion including the vertex has been removed. Because the positioning pin 43 has a truncated-cone shape, it is unlikely that the tip end of the positioning pin 43 will contact the bottom of the positioning hole 23, even when the pin is inserted into the positioning hole 23 that narrows toward the inside as illustrated in FIG. 8A. Further, even if the angle of the tapered surface 43A of the truncated-cone shape is increased, it is unlikely that the tip end of the positioning pin 43 will contact the bottom of the positioning hole 23.

Further, according to the positioning pin 43 of the first embodiment, the tapered surface 43A of the truncated-cone shape can contact the positioning hole 23 on the surface of the glass substrate 20 without leaving any space therebetween (i.e., can contact the edge of the positioning hole 23 without leaving any space therebetween), and thus, positioning errors can be suppressed. Thus, in the first embodiment, positioning accuracy can be improved in directions perpendicular to the axial direction of the positioning hole 23 and the positioning pin 43 (i.e., directions parallel to the surface of the glass substrate 20; Y direction).

FIGS. 10A and 10B are diagrams explaining how the positioning hole 23 and the positioning pin 43 according to the first embodiment are fitted. FIG. 10A illustrates how the pin and the hole are fitted in a case where the opening diameter of the positioning hole 23 (i.e., the opening diameter of the positioning hole 23 on the lower surface of the glass substrate 20) is at its maximum (=1.01 mm) and the diameter of the base of the positioning pin 43 (the diameter of the tapered surface 43A within the same plane as the upper surface of the optical path changer 40) is at its minimum (=1.01 mm). FIG. 10B illustrates how the pin and the hole are fitted in a case where the opening diameter of the positioning hole 23 is at its minimum (=0.99 mm) and the diameter of the base of the positioning pin 43 is at its maximum (=1.03 mm).

Herein, the positioning hole 23 has an opening diameter of 1.00 mm and a tolerance of ±0.01 mm. (That is, the maximum opening diameter of the positioning hole 23 is 1.01 mm, and the minimum diameter is 0.99 mm.) The positioning pin 43 has a base diameter of 1.02 mm and a tolerance of ±0.01 mm. (That is, the maximum diameter of the base of the positioning pin 43 is 1.03 mm, and the minimum diameter is 1.01 mm.) The diameters and tolerances of the positioning hole 23 and the positioning pin 43 are set so that the maximum opening diameter of the positioning hole 23 does not exceed the minimum diameter of the base of the positioning pin 43. It should be noted that the generatrix that forms the tapered surface 43A of the positioning pin 43 is inclined by 50 degrees with respect to the upper surface of the optical path changer 40.

In the state illustrated in FIG. 10A, the opening of the positioning hole 23 (the edge of the positioning hole 23) and the tapered surface 43A of the positioning pin 43 contact one another while the lower surface of the glass substrate 20 and the upper surface of the optical path changer 40 are in tight contact. With this state as a reference (amount of misalignment in the Y direction: zero; amount of misalignment in the Z direction: zero), the positioning accuracy of FIG. 10B will be studied. FIG. 10B illustrates how the pin and the hole are fitted when the diameters of the positioning hole 23 and the positioning pin 43 are in their worst conditions (when the positioning accuracy is in the lowest condition).

In the state illustrated in FIG. 10B, the positioning pin 43 contacts the positioning hole 23 with its tapered surface 43A, which has the same diameter as the opening diameter of the positioning hole 23. That is, the pin contacts the positioning hole 23 with its periphery where the diameter of the tapered surface 43A is 0.99 mm. Note, however, that the axis of the positioning pin 43 and the axis of the positioning hole 23 are at the same position. Stated differently, the central position of the cross section (circular shape) of the tapered surface 43A where the diameter is 0.99 mm matches the central position of the opening (circular shape) of the positioning hole 23. Thus, even when the positioning hole 23 and the positioning pin 43 are fitted under this condition, the amount of misalignment in directions perpendicular to the axial direction of the positioning hole 23 and the positioning pin 43 (i.e., directions parallel to the surface of the glass substrate 20; Y direction) is still zero.

Further, in the state illustrated in FIG. 10B, the pin contacts the positioning hole 23 at a position 0.024 mm upward from the base of the positioning pin 43. Thus, when the positioning hole 23 and the positioning pin 43 are fitted under this condition, there will be a 0.024-mm gap between the lower surface of the glass substrate 20 and the upper surface of the optical path changer 40. However, an amount of misalignment of around 24 μm in the direction parallel to the axial direction of the positioning hole 23 and the positioning pin 43 (i.e., the direction perpendicular to the surface of the glass substrate 20; Z direction) is within an acceptable range, as already described above.

Thus, according to the positioning hole 23 and the positioning pin 43 of the first embodiment, positioning can be performed with high accuracy in directions perpendicular to the axial direction of the positioning hole 23 and the positioning pin 43 (i.e., directions parallel to the surface of the glass substrate 20; Y direction) in cases where positioning errors in the direction parallel to the axial direction of the positioning hole 23 and the positioning pin 43 (i.e., the direction perpendicular to the surface of the glass substrate 20; Z direction) are acceptable.

Incidentally, glass (the glass substrate 20) is harder than resin (the optical path changer 40), and thus, in the state illustrated in FIG. 10B, the positioning pin 43 may deform at a section where it contacts the opening of the positioning hole 23. However, even if the positioning pin 43 deforms from the state illustrated in FIG. 10B, the deformation of the positioning pin 43 will eventually end when the lower surface of the glass substrate 20 and the upper surface of the optical path changer 40 come into tight contact, and thus, misalignment in the Z direction associated with the deformation of the positioning pin 43 will not become an issue. Further, because the optical path changer 40 is attached in a detachable fashion, the optical path changer 40 may be replaced if it is necessary to replace the deformed positioning pin 43.

Figure 11A:
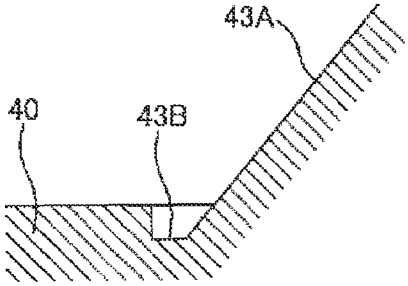
FIG. 11A is an enlarged view near the base of the positioning pin 43 according to the first embodiment.
Figure 11B:
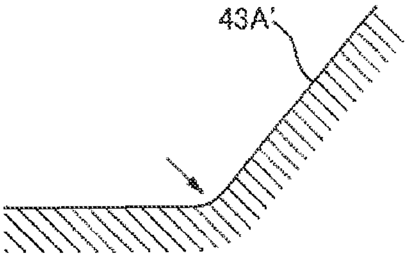
FIG. 11B is an enlarged view near the base of a positioning pin 43 according to a reference example.

FIG. 11A is an enlarged view near the base of the positioning pin 43 according to the first embodiment. FIG. 11B is an enlarged view near the base of a positioning pin 43 according to a reference example.

In general, resins shrink when molded, and so, the surface shape of a resin molded article does not exactly reflect the shape of the inner surface of a mold. For example, the corners of the molded article may become rounded.

As already described above, the optical path changer 40 of the first embodiment is integrally molded out of a transparent resin, and the positioning pins 43 are also integrally molded along with the other parts of the optical path changer 40. And as in the reference example illustrated in FIG. 11B, the corner at the base of the positioning pin (the section indicated by the arrow in the figure) may become rounded. This rounding is not formed evenly along the periphery of the positioning pin 43 (i.e., the rounding of the base of the positioning pin 43 cannot be controlled), and thus, if this section contacts the positioning hole 23, this may cause not only positional misalignment in the direction parallel to the axial direction of the positioning hole 23 and the positioning pin 43 (i.e., the direction perpendicular to the surface of the glass substrate 20; Z direction), but also positional misalignment in directions perpendicular to the axial direction of the positioning hole 23 and the positioning pin 43 (i.e., directions parallel to the surface of the glass substrate 20; Y direction).

So, as illustrated in FIG. 11A, in the first embodiment, an annular recess 43B is formed so as to surround the periphery the base of the positioning pin 43. Further, the side wall surface on the inner side of the recess 43B is an extended surface of the tapered surface 43A of the truncated-cone-shaped positioning pin 43. That is, the tapered surface 43A of the positioning pin 43 is formed more toward the inside (i.e., the side opposite from the side toward which the positioning pin 43 protrudes) than the upper surface of the optical path changer 40. In this way, even if the corner of the base of the positioning pin 43 is rounded, this section is located more toward the inside than the upper surface of the optical path changer 40. Thus, the rounded corner at the base of the positioning pin 43 does not contact the positioning hole 23, even if the positioning pin 43 is inserted into the positioning hole 23 until the lower surface of the glass substrate 20 and the upper surface of the optical path changer 40 come into tight contact. As described above, in the first embodiment, positioning accuracy is improved by forming an annular recess 43B at the base of the positioning pin 43.

It should be noted that, even in cases where a truncated-cone-shaped positioning pin 43 with a recess 43B is inserted into a constant-diameter positioning hole (see FIG. 8B), positioning can be performed without being affected by the rounded corner at the base of the positioning pin 43. Likewise, even in cases where a truncated-cone-shaped positioning pin 43 with a recess 43B is inserted into a through hole rather than a non-through hole, positioning can be performed without being affected by the rounded corner at the base of the positioning pin 43. (The present embodiment, however, is based on the premise that the positioning hole has a shape that narrows toward the inside.)

Second Embodiment

FIG. 12A is an explanatory diagram of the positioning holes 23 according to the first embodiment.

In the first embodiment, the spacing L between the two positioning holes 23 in the glass substrate 20 may vary depending on the influence of manufacturing errors etc. Alternatively, the spacing between the two positioning pins 43 of the optical path changer 40, which is not illustrated, may vary depending on the influence of manufacturing errors etc. Alternatively, because of the difference in the coefficient of thermal expansion between glass (the glass substrate 20) and resin (the optical path changer 40), the spacing between the two positioning holes 23 and the spacing between the two positioning pins 43 may become different from one another due to changes in temperature. If there is a difference between the spacing between the two positioning holes 23 and the spacing between the two positioning pins 43 as described above, the two positioning pins 43 may not be inserted properly in the respective positioning holes 23 and the positional misalignment between the glass substrate 20 and the optical path changer 40 may become greater than anticipated, even if the diameter of each positioning hole 23 and the diameter of each positioning pin 43 are within the designed dimensions.

FIG. 12B is an explanatory diagram of positioning holes according to a second embodiment. In the second embodiment, one of the two positioning holes serves as a reference hole 23A, and the other is formed as a long hole 23B. The reference hole 23A has the same shape as the positioning hole 23 of the first embodiment. It should be noted that the two positioning pins 43 to be inserted into the reference hole 23A and the long hole 23B have the same shapes as the positioning pins of the foregoing first embodiment (i.e., the two positioning pins 43 both have a truncated-cone shape).

The long hole 23B is a non-through hole like the reference hole 23A. The long hole 23B is also formed by sandblasting, and thus has a shape that narrows toward the inside. The width of the long hole 23B is the same length as the diameter of the reference hole 23A. The longitudinal direction of the long hole 23B is along a line connecting the two positioning holes (the reference hole 23A and the long hole 23B).

One of the two positioning pins 43 of the optical path changer 40 is inserted in the reference hole 23A, and the other is inserted in the long hole 23B. On the long hole 23B side, the positioning pin 43 is restrained by the long hole 23B from the left/right direction, but is not restrained from the front/rear direction. However, on the reference hole 23A side, the truncated-cone-shaped tapered surface 43A of the positioning pin 43 contacts the reference hole 23A without leaving any space therebetween, so the positioning pin 43 is restrained with respect to the reference hole 23A in the front/rear direction and the left/right direction (i.e., in directions parallel to the surface of the glass substrate 20), which are perpendicular to the axial direction of the positioning pin 43. Thus, the positioning pin 43 inserted in the long hole 23B will not move in the front/rear direction with respect to the long hole 23B, and the glass substrate 20 and the optical path changer 40 are positioned with respect to one another with high accuracy by the positioning pins 43 and the positioning holes 23 in directions parallel to the surface of the glass substrate 20.

It should be noted that, in the second embodiment, it is preferable to arrange the light-emitting section 31 (or the light-receiving section), which is mounted on the glass substrate 20, so that it has a predetermined positional relationship with reference to the reference hole 23A. Likewise, it is preferable to arrange the lens section 41 (not illustrated), which is formed in the optical path changer 40, so that it has a predetermined positional relationship with reference to the positioning pin 43 inserted in the reference hole 23A. In this way, the light-emitting section 31 and the lens section 41 are positioned with high accuracy.

Third Embodiment

The optical module 1 according to the foregoing first embodiment is of the QSFP type and has one circuit board 10 inside the housing 1A. However, the number of circuit boards provided to the optical module is not limited to one.

Figure 13:
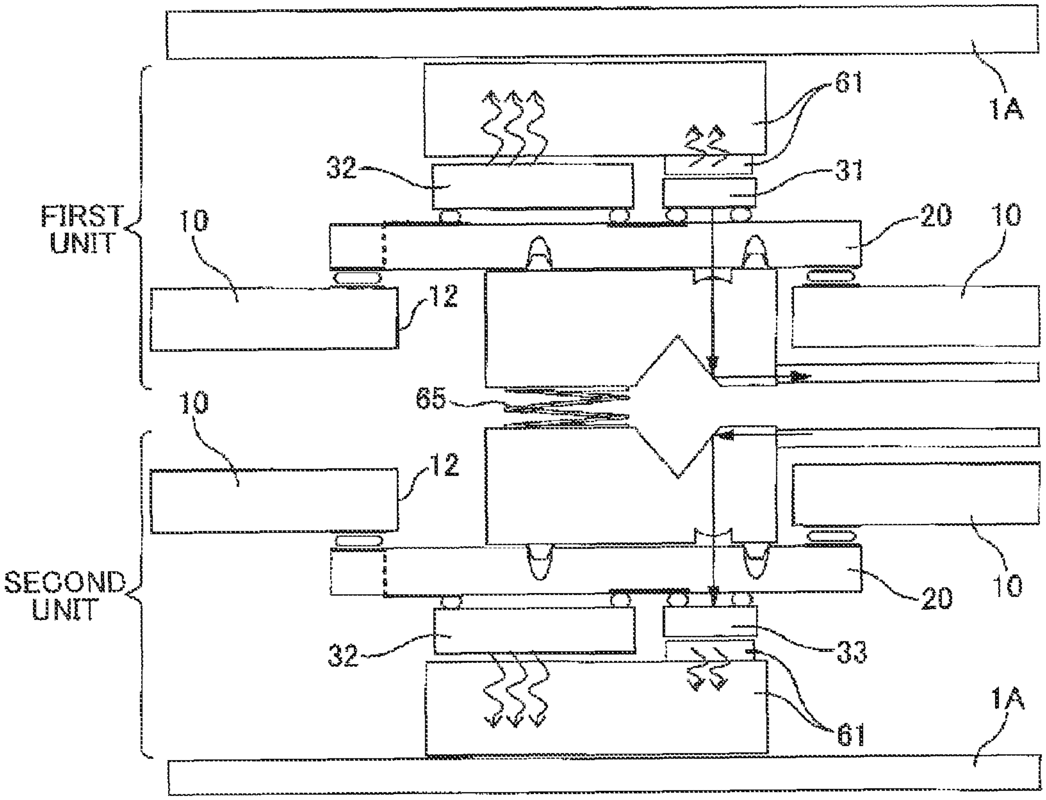
FIG. 13 is a schematic configuration diagram of an optical module according to a third embodiment.

FIG. 13 is a schematic configuration diagram of an optical module according to a third embodiment. The optical module of the second embodiment is of the CXP type, and has two circuit boards 10 inside the housing 1A.

As illustrated in the figure, there are two units, each made up of a circuit board 10, a glass substrate 20, and an optical path changer 40. The first unit on the upper side is a transmitting-side unit, and is configured similarly to the circuit board 10, the glass substrate 20, the light-emitting section 31, and the optical path changer 40 in the foregoing first embodiment. The second unit on the lower side is arranged such that the circuit board 10, the glass substrate 20, and the optical path changer 40, which are configured similarly to the first unit, are flipped upside down. The lower-side second unit is a receiving-side unit, and so, a light-receiving section 33 is mounted on the glass substrate 20 of the second unit, instead of the light-emitting section 32. It should be noted that the upper-side unit may be configured as the receiving-side unit, and the lower-side unit may be configured as the transmitting-side unit.

Also in the second unit, the glass substrate 20 is mounted on the circuit board 10 so as to close the housing window 12 of the circuit board 10, and the optical path changer 40 is attached to the glass substrate 20 on the opposite surface (upper surface) from the mounting surface (lower surface) where the light-receiving section 33 is mounted, and the optical path changer 40 is arranged so as to be inserted in the housing window 12 of the circuit board 10. In this way, the second unit can be reduced in height, and also the entire optical module according to the third embodiment can be reduced in height.

The optical path changer 40 of the first unit and the optical path changer 40 of the second unit oppose one another. A spring 65 is arranged between the two optical path changers 40. The spring 65 is compressed, and urges the optical path changers 40 in the respective units toward the respective glass substrates 20. That is, the spring 65 urges the optical path changer 40 of the first unit upward toward the glass substrate 20, and urges the optical path changer 40 of the second unit downward toward the glass substrate 20. In this way, in both units, the fit between the positioning holes 23 of the glass substrate 20 and the positioning pins 43 of the optical path changer 40 becomes reliable and less likely to be disengaged.

It should be noted that, in the third embodiment, both the first and second units are reduced in height, and thus, the optical path changers 40 of both units can be arranged in opposition to one another inside the small housing 1A. And because such an arrangement is possible, it is possible to arrange the spring 65 between the two optical path changers 40.

A heat-dissipating sheet 61 is arranged on the outer side (the housing 1A side) of the light-emitting section 31 and the drive element 32 of each unit. That is, a heat-dissipating sheet 61 is arranged on the upper side of the light-emitting section 31 and the drive element 32 of the first unit, and a heat-dissipating sheet 61 is arranged also on the lower side of the light-emitting section 31 and the drive element 32 of the second unit. The spring 65 functions as a force-applying member that urges the optical path changers 40 toward the respective glass substrates 20 and that applies force in directions in which the photoelectric conversion elements (the light-emitting section 31; the light-receiving section 33) and the drive elements 32 are brought into tight contact with the respective heat-dissipating sheets 61. This facilitates the conduction of heat generated by the photoelectric conversion elements and the drive elements 32 to the heat-dissipating sheets.

Further, the spring 65 applies force so that each heat-dissipating sheet 61 is sandwiched between the housing 1A and the photoelectric conversion element (the light-emitting section 31 or the light-receiving section 33) and the drive element 32. This facilitates the dissipation of heat generated by the photoelectric conversion elements and the drive elements 32 to the outside (the cage 2 or the main board provided in the cage 2) via the respective heat-dissipating sheets.

It should be noted that, although the spring 65 is illustrated as a coil spring, the shape/form is not limited thereto. For example, the spring may be a flat spring, or springs of other shapes. Further, the optical path changers 40 may be urged toward the respective glass substrates 20 by using a tool, like the fixing tool 62 of the first embodiment, and tightly pressing the first and second units from the outside.

===Others===

The foregoing embodiments are for facilitating the understanding of the present invention and are not to be construed as limiting the present invention. It goes without saying that the present invention can be modified and improved without departing from the gist thereof and encompasses equivalents. In particular, the present invention encompasses the following features.

<Circuit Board>

In the foregoing embodiments, the glass substrate 20 was mounted so as to close the housing window 12 of the circuit board 10. However, by forming, in the glass substrate 20, a non-through positioning hole that narrows toward the inside thereof and forming a truncated-cone-shaped positioning pin on the optical path changer 40, the glass substrate 20 and the optical path changer 40 can be positioned with respect to one another by inserting the positioning pin into the positioning hole—even in cases where no housing window 12 is formed in the circuit board as illustrated in FIGS. 5B and 5C.

In short, it will suffice if: a non-through positioning hole that narrows toward the inside thereof is formed in one member (e.g. the glass substrate 20) of two members; a truncated-cone-shaped positioning pin is formed on the other member (e.g. the optical path changer 40); and the two members are positioned with respect to one another by inserting the positioning pin into the positioning hole. Therefore, the member in which the positioning hole is formed is not limited to the glass substrate 20. Likewise, the member on which the positioning pin is formed is not limited to the optical path changer 40.

<Positioning Hole and Positioning Pin>

The aforementioned positioning hole was formed by sandblasting. However, the positioning hole may be formed by etching or other machining methods. Even with other machining methods, positioning accuracy in directions perpendicular to the axial direction of the positioning hole and the positioning pin (i.e., in directions parallel to the surface of the glass substrate 20) can be improved by the insertion of a truncated-cone-shaped positioning pin, so long as the positioning hole has a shape that narrows toward the inside.

Further, the positioning hole does not have to be shaped so as to narrow toward the inside, but may be a constant-diameter hole as illustrated in FIG. 8B, for example. Also, the positioning pin does not have to be in a truncated-cone shape, but may be conical as illustrated in FIG. 9B or cylindrical as illustrated in FIG. 9C.

Further, the positioning hole does not have to be a non-through hole, but may be a through hole. This, however, will reduce the degree of freedom in mounting components and arranging wiring on the upper surface of the glass substrate 20.

Also, an optical path changer having the aforementioned truncated-cone-shaped positioning pin may be used for positioning with a member having a positioning hole that does not narrow toward the inside.

<Optical Module>

The foregoing embodiments were explained by employing QSFP- and CXP-type optical modules. The optical module, however, is not limited thereto. The invention is applicable to other types of optical modules (e.g. SFP type).

<Fixing Tool>

Figure 14:
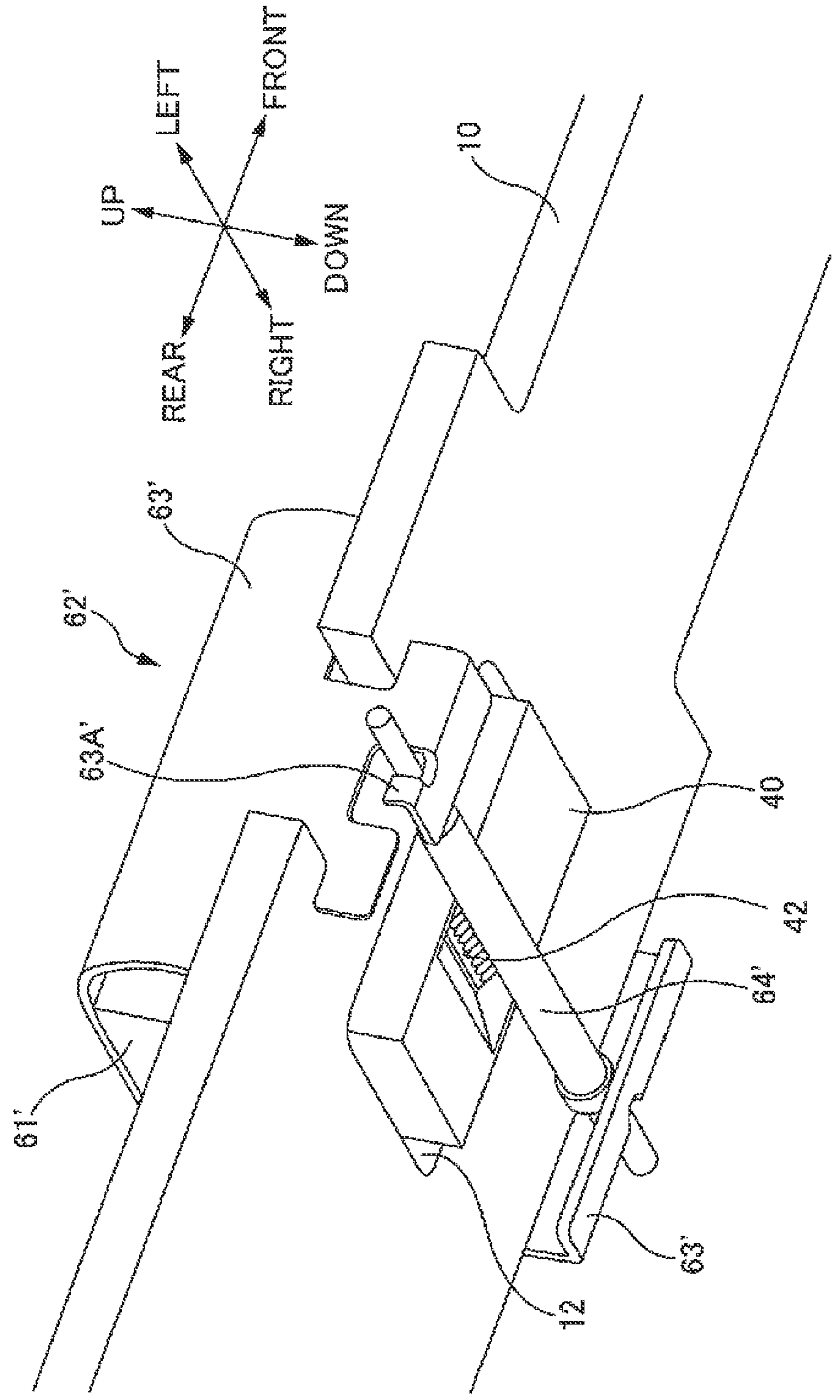
FIG. 14 is a perspective view of a fixing tool 62' according to a modified example.

FIG. 14 is a perspective view of a fixing tool 62' according to a modified example. The fixing tool 62' is made up of a body 63' formed by bending a metal sheet into a U-shaped cross section, and a fastening pin 64'. The fastening pin 64' is fixed to one end of the body 63' with a U-shaped cross section. An engagement section 63A' for fastening the fastening pin 64' is formed in the other end of the body 63'.

The body 63' with a U-shaped cross section is arranged so as to cross over the circuit board 10 in the left/right direction and cover the heat-dissipating sheet 61 from above. Both ends of the body protrude from the lower side of the circuit board 10. The fastening pin 64' is fastened to the engagement section 63A' of the body 63' while pressing the lower surface of the optical path changer 40. When the fastening pin 64' is fastened to the engagement section 63A' of the body 63', the fixing tool 62' tightly presses the members inside the body 63' (the glass substrate 20, the light-emitting section 31, the optical path changer 40, the heat-dissipating sheet 61, etc.) in the up/down direction.

The fixing tool 62' of the modified example does not cover the reflective section 42 of the optical path changer 40 from outside. Thus, dirt may adhere to the reflective section 42 of the optical path changer 40, and the optical characteristics of the reflective section 42 may change.

However, even with the fixing tool 62' of the modified example, the fastening pin 64' urges the optical path changer 40 upward, and the body 63' urges the glass substrate 20 downward via the heat-dissipating sheet 61. That is, the fixing tool 62' of the modified example functions as a force-applying member that applies a force in the direction in which the positioning pins 43 of the optical path changer 40 are inserted into the positioning holes 23 of the glass substrate 20. Thus, the fit between the positioning holes 23 of the glass substrate 20 and the positioning pins 43 of the optical path changer 40 becomes reliable and less likely to be disengaged.

Further, also the fixing tool 62' of the modified example functions as a force-applying member that applies a force in the direction in which the light-emitting section 31 and the drive element 32 are brought into tight contact with the heat-dissipating sheet 61. This facilitates the conduction of heat generated by the light-emitting section 31 and the drive element 32 to the heat-dissipating sheet 61.

REFERENCE SIGNS LIST

1: Optical module; 1A: Housing;
2: Cage; 2A: Connector; 3: Heat sink;
10: Circuit board; 11: Connecting section;
12: Housing window; 13: Circuit-board-side electrode;
20: Glass substrate (transparent substrate); 21: Through via;
22: Glass-substrate-side electrode;
23: Positioning hole; 23A: Reference hole; 23B: Long hole;
31: Light-emitting section;
31A: Light-emitting-section-side electrode;
31B: Light-emitting face;
32: Drive element; 33: Light-receiving section;
40: Optical path changer (support member); 41: Lens section;

42: Reflective section;
43: Positioning pin; 43A: Tapered surface; 43B: Recess;
44: Fiber support section;
50: Optical fiber; 61: Heat-dissipating sheet;
62: Fixing tool;
63: Body; 63A, 63A': Engagement section;
64: Fastening plate; 64': Fastening pin;
65: Spring.

The invention claimed is:

1. An optical module comprising a transparent substrate through which light can pass, a photoelectric conversion element that is mounted on said transparent substrate and that emits light toward said transparent substrate or receives light having passed through said transparent substrate, and a support member that supports an optical fiber for transmitting light, said support member and said transparent substrate together forming an optical path between said photoelectric conversion element and said optical fiber, wherein:

a positioning hole is formed in said transparent substrate;

a positioning pin having a tapered surface is formed on said support member;

said transparent substrate and said support member are positioned with respect to one another by inserting said positioning pin into said positioning hole along the optical axis direction of light between said transparent substrate and said support member and by making said tapered surface of said positioning pin contact the edge of said positioning hole without leaving any space therebetween; and an optical system of said support member is configured such that, in a state where said transparent substrate and said support member are in tight contact, light emitted from said photoelectric conversion element converges onto a point that is farther than an end surface of said optical fiber as viewed from the side of said photoelectric conversion element and that is located within the optical fiber.

2. The optical module according to claim 1, wherein the diameter of the base of said positioning pin is larger than or equal to the opening diameter of said positioning hole.

3. The optical module according to claim 1, wherein:

said positioning hole is formed as anon-through positioning hole that narrows toward the inside thereof; and said positioning pin is formed as a truncated-cone-shaped positioning pin.

4. The optical module according to claim 1, wherein said transparent substrate is harder than said support member.

5. The optical module according to claim 1, wherein a recess is formed around the base of said positioning pin.

6. An optical module comprising a transparent substrate through which light can pass, a photoelectric conversion element that is mounted on said transparent substrate and that emits light toward said transparent substrate or receives light having passed through said transparent substrate, and a support member that supports an optical fiber for transmitting light, said support member and said transparent substrate together forming an optical path between said photoelectric conversion element and said optical fiber, wherein:

a positioning hole is formed in said transparent substrate;

a positioning pin having a tapered surface is formed on said support member;

said transparent substrate and said support member are positioned with respect to one another by inserting said positioning pin into said positioning hole along the optical axis direction of light between said transparent substrate and said support member and by making said tapered surface of said positioning pin contact the edge of said positioning hole without leaving any space therebetween; and a force-applying member that applies a force in a direction in which said positioning pin is inserted into said positioning hole, wherein:

said support member includes a reflective section that reflects said light in said optical path; and at least a portion of said force-applying member covers an outer side of said reflective section.

7. An optical module comprising a transparent substrate through which light can pass, a photoelectric conversion element that is mounted on said transparent substrate and that emits light toward said transparent substrate or receives light having passed through said transparent substrate, and a support member that supports an optical fiber for transmitting light, said support member and said transparent substrate together forming an optical path between said photoelectric conversion element and said optical fiber, wherein:

a positioning hole is formed in said transparent substrate;

a positioning pin having a tapered surface is formed on said support member;

said transparent substrate and said support member are positioned with respect to one another by inserting said positioning pin into said positioning hole along the optical axis direction of light between said transparent substrate and said support member and by making said tapered surface of said positioning pin contact the edge of said positioning hole without leaving any space therebetween;

a force-applying member that applies a force in a direction in which said positioning pin is inserted into said positioning hole, and a heat-dissipating member that dissipates heat from said photoelectric conversion element, wherein said force-applying member is configured so as to apply a force in a direction in which said photoelectric conversion element and said heat-dissipating member are brought into tight contact.

8. An optical module comprising a transparent substrate through which light can pass, a photoelectric conversion element that is mounted on said transparent substrate and that emits light toward said transparent substrate or receives light having passed through said transparent substrate, a support member that supports an optical fiber for transmitting light, said support member and said transparent substrate together forming an optical path between said photoelectric conversion element and said optical fiber, wherein:

a positioning hole is formed in said transparent substrate;

a positioning pin having a tapered surface is formed on said support member; and said transparent substrate and said support member are positioned with respect to one another by inserting said positioning pin into said positioning hole along the optical axis direction of light between said transparent substrate and said support member and by making said tapered surface of said positioning pin contact the edge of said positioning hole without leaving any space therebetween;

a second transparent substrate, a second photoelectric conversion element, and a second support member which are separate from said transparent substrate, said photoelectric conversion element, and said support member; and a force-applying member that applies a force in a direction in which said positioning pin on said support member is inserted into said positioning hole in said transparent substrate, and that applies a force in a direction in which a positioning pin formed on said second support member is inserted into a positioning hole formed in said second transparent substrate.

9. An optical module comprising a transparent substrate through which light can pass, a photoelectric conversion element that is mounted on said transparent substrate and that emits light toward said transparent substrate or receives light having passed through said transparent substrate, and a support member that supports an optical fiber for transmitting light, said support member and said transparent substrate together forming an optical path between said photoelectric conversion element and said optical fiber, wherein:

a positioning hole is formed in said transparent substrate;

a positioning pin having a tapered surface is formed on said support member;

said tapered surface of said positioning pin contacts the edge of said positioning hole without leaving any space therebetween;

an axial direction of said positioning hole and an axial direction of said positioning pin are parallel to the optical axis direction of light between said transparent substrate and said support member; and an optical system of said support member configured such that, in a state where said transparent substrate and said support member are in tight contact, light emitted from said photoelectric conversion element converges onto a point that is farther than an end surface of said optical fiber as viewed from the side of said photoelectric conversion element and that located within the optical fiber.

* * * * *